(12) United States Patent
Tajima

(10) Patent No.: US 8,439,717 B2
(45) Date of Patent: May 14, 2013

(54) DEVICE AND METHOD FOR MANUFACTURING ACTIVE MATRIX SUBSTRATE, AND DEVICE AND METHOD FOR MANUFACTURING DISPLAY PANEL

(75) Inventor: Yoshimitsu Tajima, Osaka (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 8 days.

(21) Appl. No.: 13/322,826

(22) PCT Filed: Feb. 16, 2010

(86) PCT No.: PCT/JP2010/000926
§ 371 (c)(1),
(2), (4) Date: Nov. 28, 2011

(87) PCT Pub. No.: WO2011/001557
PCT Pub. Date: Jan. 6, 2011

(65) Prior Publication Data
US 2012/0077408 A1    Mar. 29, 2012

(30) Foreign Application Priority Data

Jun. 29, 2009 (JP) .................. 2009-153743

(51) Int. Cl.
*H01J 9/50* (2006.01)
(52) U.S. Cl.
USPC ...................... 445/2; 445/3; 445/61
(58) Field of Classification Search .................. 445/2, 3, 445/60, 61, 63
See application file for complete search history.

(56) References Cited

U.S. PATENT DOCUMENTS

| | | |
|---|---|---|
| 5,309,108 A | 5/1994 | Maeda et al. |
| 2003/0137318 A1 | 7/2003 | Enachescu et al. |
| 2003/0222220 A1 | 12/2003 | Enachescu et al. |
| 2005/0270059 A1 | 12/2005 | Ando |
| 2006/0226866 A1 | 10/2006 | Ando |
| 2007/0036420 A1 | 2/2007 | Enachescu et al. |
| 2008/0002076 A1 | 1/2008 | Yagi et al. |

FOREIGN PATENT DOCUMENTS

| | | |
|---|---|---|
| JP | 5-340905 A | 12/1993 |
| JP | 6-51011 A | 2/1994 |
| JP | 2001-284562 A | 10/2001 |
| JP | 2005-345546 A | 12/2005 |
| JP | 2008-203889 A | 9/2008 |
| JP | 2009-8687 A | 1/2009 |

OTHER PUBLICATIONS

International Search Report, dated May 25, 2010 in PCT/JP2010/000926.

*Primary Examiner* — Joseph L Williams
(74) *Attorney, Agent, or Firm* — Birch, Stewart, Kolasch & Birch, LLP

(57) ABSTRACT

A device for manufacturing an active matrix substrate including a plurality of pixels arranged in a matrix, in which a short-circuit defect in the active matrix substrate is detected and repaired, includes a stage (30a) configured to place a test substrate (19) which will become the active matrix substrate, a defective pixel detector (40a) configured to input a test signal to the test substrate (19) placed on the stage (30a), and electrically detect coordinates of a defective pixel in which a short-circuit defect has occurred, and a defect position identifier (50) configured to input the test signal to the test substrate (19) placed on the stage (30a) to cause the defective pixel detected by the defective pixel detector (40a) to generate heat, and sense the heat generation in the defective pixel using far-infrared thermography, thereby identifying a position of the short-circuit defect in the defective pixel.

13 Claims, 10 Drawing Sheets

DEVICE AND METHOD FOR MANUFACTURING ACTIVE MATRIX SUBSTRATE, AND DEVICE AND METHOD FOR MANUFACTURING DISPLAY PANEL

TECHNICAL FIELD

The present invention relates to devices and methods for manufacturing active matrix substrates, and devices and methods for manufacturing display panels, and more particularly, to techniques of detecting defects in active matrix substrates and display panels.

BACKGROUND ART

In a liquid crystal display panel including an active matrix substrate, a thin film transistor (hereinafter referred to as a "TFT") is provided in each pixel, which is the smallest unit of an image, for example. By switching each TFT on or off to reliably apply a predetermined voltage to the liquid crystal layer of the corresponding pixel, a high-resolution image can be displayed.

In recent years, as the pixel resolutions of active matrix substrates and liquid crystal display panels including the active matrix substrates have been increased, there has been a higher risk of a defect occurring in a pixel, which is, for example, caused when film formation or etching is performed in the presence of foreign matter (called a particle) adhering to a substrate surface during manufacture of the active matrix substrate.

For example, PATENT DOCUMENT 1 describes a testing method for finding a short-circuit defect between a scanning line and a signal line which include a plurality of interconnects by passing a current between the scanning line and the signal line, and particularly, for identifying the address of a defective pixel using an infrared image.

PATENT DOCUMENT 2 describes a testing method and device for identifying the address of a defective pixel using an infrared image, particularly by causing the power supply and the substrate load impedance to match each other so that power transmission is maximized, thereby increasing heating efficiency, and utilizing a difference in relaxation time of a transient phenomenon of temperature increase between a defective pixel and a normal pixel.

In the defect detection methods of PATENT DOCUMENTS 1 and 2, however, the infrared imaging device is directed to the entire display panel, and therefore, a defective pixel can be identified, but the position of a defective portion in the defective pixel may not be accurately identified.

CITATION LIST

Patent Documents

PATENT DOCUMENT 1: Japanese Patent Publication No. H06-51011
PATENT DOCUMENT 2: Japanese Patent Publication No. 2009-8687

SUMMARY OF THE INVENTION

Technical Problem

FIG. 16 is a plan view of an example active matrix substrate 120 in which a pair of two separated capacitor electrodes are provided in each pixel.

As shown in FIG. 16, the active matrix substrate 120 includes a plurality of pixel electrodes 118 arranged in a matrix, a plurality of gate lines 114a arranged in parallel with each other and along upper and lower sides of the corresponding pixel electrodes 118, a plurality of source lines 116a arranged in parallel with each other and along left and right sides of the corresponding pixel electrodes 118, a plurality of capacitor lines 114b arranged in parallel with each other and between the corresponding gate lines 114a, and TFTs 105 one or more of which correspond to each pixel electrode 118.

The TFT 105 includes a semiconductor layer 112 provided on the substrate, a gate insulating film (not shown) covering the semiconductor layer 112, a gate electrode 114aa provided on the gate insulating film, a first interlayer insulating film (not shown) covering the gate electrode 114aa, and a source electrode (source line 116a) and a drain electrode 116b which are provided on the first interlayer insulating film. Here, on the first interlayer insulating film, a second interlayer insulating film (not shown) is provided, covering the source electrode (source line 116a) and the drain electrode 116b. As shown in FIG. 16, the source electrode (source line 116a) and the drain electrode 116b are connected to the semiconductor layer 112 via contact holes 115a and 115b which penetrate through the multilayer film of the gate insulating film and the first interlayer insulating film. The drain electrode 116b is connected to a drain region of the semiconductor layer 112, and also to the pixel electrode 118a via a contact hole 117a penetrating through the second interlayer insulating film. As shown in FIG. 16, the drain region of the semiconductor layer 112 has, for example, a pair of two separated capacitor electrodes 112da and 112db. The capacitor electrodes 112da and 112db overlap the capacitor line 114b via the gate insulating film to form a pair of auxiliary capacitors. Note that, in FIG. 16, the two separated capacitor electrodes are illustrated, and in all the description of the present invention that follows, two separated capacitor electrodes are illustrated as well. Alternatively, three or more separated capacitor electrodes may be used without departing the spirit and scope of the present invention, and in this case, the same operation and advantages are obtained.

Here, in an actual manufacturing process of an active matrix substrate, an electrical test is conducted using, for example, a charge detection technique of accessing the TFTs of pixels, writing charge to the auxiliary capacitors of the pixels, and reading the charge written in the auxiliary capacitors to detect the presence or absence of a short-circuit defect or other defects (a defective characteristic, a defective connection, etc.) in each pixel. In addition, a repairable defect is repaired by performing operations, such as cutting off, joining, modification, etc., singly or in combination, by irradiation with laser light, thereby improving the manufacturing yield.

In the active matrix substrate 120 thus configured, however, if a minute leakage defect having a diameter of about several micrometers is formed in the gate insulating film to generate a defective pixel which causes flow of a weak current between the capacitor electrode 112da or 112db and the capacitor line 114b, which leads to leakage of charge, the aforementioned electrical testing technique may determine that the defect has occurred as a short-circuit defect in the auxiliary capacitor pair of the pixel, but cannot identify the position of the short-circuit defect in the auxiliary capacitor pair of the pixel. Specifically, it cannot be determined in which of the auxiliary capacitors of the pair the short-circuit defect has occurred. Here, if there are no constraints on devices or equipment, the auxiliary capacitor of the pixel can be observed using an optical microscope etc. to optically detect a short-circuit portion. However, it is difficult to detect the defect quickly. When a minute temperature change is detected using a detector, it is desirable to operate the detector in a region where the detector has a high level of sensitivity. According to Wien's displacement law ($\lambda=2897/T$ [µm]), the peak wavelength of radiation at room temperature (about 300 K) is 9 µm. Based on this, in order to increase the sensitivity of detection, an observation band is desirably set to fall within a far-infrared region having a wavelength range of 1-3 µm (hereinafter referred to as a "far-infrared region"). However, in the testing technique described in PATENT DOCUMENT 1, it is considered that observation in the far-infrared region is not very suitable in terms of sensitivity and imaging capability. Also, in the testing technique described in PATENT DOCUMENT 1, the position of a short-circuit defect in an individual pixel is visually identified. For example, for a minute bright point caused by minute leakage (a leakage current having less than several nanoamperes), a defect factor thereof is in the shape of a pinhole having a diameter of about several micrometers, and therefore, it is considered that it is difficult to easily visually detect a short-circuit defect. Moreover, in the testing technique described in PATENT DOCUMENT 1, a coordinate point indicating an extraordinary value which is higher than or equal to a threshold is extracted based on a difference (or a quotient) between an infrared image in the presence of an applied voltage and an infrared image in the absence of an applied voltage to determine a short-circuit defect. Therefore, in order to ensure the accuracy of detection, it may be necessary to wait until each of the two images has settled to a steady state, i.e., a predetermined waiting time may be required. That is, in order to ensure the accuracy of the detection result, it may take a longer time to perform testing, i.e., the testing time may be sacrificed.

The present invention has been made in view of the above problems. It is an object of the present invention to identify the position of a short-circuit defect in a defective pixel as easily as possible.

Solution to the Problem

To achieve the object, in the present invention, after coordinates of a defective pixel are detected, a test signal is input to a test substrate or a test panel to cause the defective pixel to generate heat, and the heat generation in the defective pixel is sensed using far-infrared thermography, thereby identifying a position of a short-circuit defect causing the defective pixel.

Specifically, a device for manufacturing an active matrix substrate including a plurality of pixels arranged in a matrix, according to the present invention, in which a short-circuit defect in the active matrix substrate is detected and repaired, includes a stage configured to place a test substrate which will become the active matrix substrate, a defective pixel detector configured to input a test signal to the test substrate placed on the stage, and electrically detect coordinates of a defective pixel in which a short-circuit defect has occurred, and a defect position identifier configured to input the test signal to the test substrate placed on the stage to cause the defective pixel detected by the defective pixel detector to generate heat, and sense the heat generation in the defective pixel using far-infrared thermography, thereby identifying a position of the short-circuit defect in the defective pixel.

With the above configuration, in the defective pixel detector, by inputting a test signal to the test substrate, the signal (source) line number and scanning (gate) line number of a defective pixel having a short-circuit defect are determined, whereby the coordinates of the defective pixel in the test substrate are found, for example. Thereafter, in the defect position identifier, by inputting a test signal to the test substrate again, the defective pixel is caused to generate heat, and the heat generation in the defective pixel at the coordinate point found by the defective pixel detector is sensed using far-infrared thermography, whereby the position of the short-circuit defect in the defective pixel is identified. In this case, according to Wien's displacement law, the peak wavelength of radiation at room temperature is 9 µm, and therefore, the heat generation caused by the short-circuit defect in the defective pixel is sensed by far-infrared thermography with higher sensitivity than when near-infrared thermography is used, which is expected to be used in the test method described in PATENT DOCUMENT 1. Therefore, the position of the short-circuit defect in the defective pixel can be identified as easily as possible.

The test substrate may include a plurality of capacitor lines arranged in parallel with each other, a thin film transistor for each of the pixels, and a plurality of separated capacitor electrodes for each of the pixels, where the plurality of separated capacitor electrodes for each of the pixels overlap the corresponding capacitor line with an insulating film being interposed therebetween and are connected to the corresponding thin film transistor. The defective pixel detector may detect the coordinates of the defective pixel using a charge detection technique.

With the above configuration, in each pixel of the test substrate, a plurality of auxiliary capacitors include a capacitor line, a plurality of capacitor electrodes, and an insulating film between the capacitor line and the capacitor electrodes. Therefore, by using a charge detection technique, the thin film transistor of each pixel is accessed to write charge corresponding to the test signal to the plurality of auxiliary capacitors of each pixel, and thereafter, the charge written in the auxiliary capacitors is read out and subjected to a statistical process, whereby the presence or absence of a short-circuit defect in each pixel is detected. As a result, a signal (source line) number and a scanning (gate line) number corresponding to a defective pixel in the test substrate in which a short-circuit defect has occurred are electrically detected. Therefore, for example, coordinates of the defective pixel in the test substrate can be specifically identified.

The defective pixel detector may include a high frequency signal generator.

With the above configuration, the defective pixel detector includes a high frequency signal generator, and therefore, a test signal having an alternating-current waveform with any frequency can be input to the plurality of auxiliary capacitors of each pixel. Therefore, an increase in temperature due to a short-circuit defect caused by weak leakage in the test substrate is easily sensed using an alternating current based on a principle described below, even when it cannot be easily sensed using a direct current.

Firstly, a case where a test signal having a direct-current waveform is input to each auxiliary capacitor will be described. Note that it is assumed that a short-circuit defect occurs in an insulating layer (e.g., silicon oxide) provided between a capacitor line made of tungsten and a capacitor electrode made of silicon.

When a predetermined voltage E is applied to resistances $R_1$ and $R_2$ ($R_1 \gg R_2$) connected together in series, the resistance $R_1$ having a larger resistance value generates a disproportionately larger amount of heat because power consumptions $P_{R1}$ and $P_{R2}$ at the resistances $R_1$ and $R_2$ are proportional to the resistance values of the resistances $R_1$ and $R_2$, respectively [$P_{R1}/R_1 = P_{R2}/R_2 = \{E/(R_1+R_2)\}^2$].

There are the following relationships between heat and temperature:

[heat balance ($\Delta Q/J$)]=[heat capacity at temperature $T(C(T)/JK^{-1})$]×[change in temperature ($\Delta T/K$)]; and

[Joule heat value ($\Delta QJ/J$)]=$\int$ {[passing current ($I/A$)]× [applied voltage ($E/V$)]}$d$[current passage time ($t/s$)]

Therefore, the temperature increase in the presence of an applied direct current is represented by the following expression, assuming that there is no work to the outside.

$$C(T) \cdot \Delta T = \int (I \cdot E) dt$$

For example, if the resistance $R_2$ of the internal interconnect is 1 M$\Omega$, and a direct-current voltage of 5 V is applied to a pixel having a pinhole-like short-circuit defect corresponding to a resistance of 500 G$\Omega$ connected in series to the resistance $R_2$, a current of 10 pA flows, each resistance consumes power $P_{Rx}$, specifically, 50 pW at the leakage resistance $R_1$, and 0.1 fW at the interconnect resistance $R_2$. A dominant amount of power is consumed by the leakage resistance $R_1$. If it is assumed that the leakage resistance $R_1$ portion is in the shape of a cylinder having a thickness (d=1 μm) and a diameter (2r=3 μm$\phi$), a heat value at the leakage portion is temporarily consumed to increase the temperature of a heat generation portion, where the rate of the temperature increase is 4.26 Ks$^{-1}$, which is obtained by:

$$\{C_v(T)V\}dT/dt = \{I \cdot E\} - dQ_{dis}/dt$$

where $C_{v,Si}$ is the heat capacity at constant volume of silicon (1.66 Jcm$^{-3}$K$^{-1}$), and V is the volume of the cylinder (2.25π× 10$^{-4\times3}$ cm$^3$) (assuming that the second term is zero).

However, if the temperature of the short-circuit defect region in the test substrate increases locally, in an actual test substrate the heat occurring in the short-circuit defect is exchanged in an amount which is proportional to a temperature gradient [grad(T)] between the short-circuit defect region and the surrounding region. The heat exchange is diffused at a heat flux density ($J=S^{-1} \times dQ_{dis}/dt = -\kappa \times \mathrm{grad}(T)$) through a cross-section S (m$^2$) as a window. For example, a heat quantity $Q_{Joule}$ (50 aJ (attojoule)) generated by passage of a current through the leakage resistance $R_1$ for 1 μsec is diffused to the surrounding region at a diffusion amount of 6 fJ, which is several hundreds times as large as the heat quantity, due to a temperature gradient caused by an instantaneous temperature increase at the heat source. Therefore, even if a test signal having a direct-current waveform is input to each auxiliary capacitor, a heat value at a short-circuit defect in the test substrate is much smaller than a diffusion amount to the surrounding region, and therefore, it is difficult to sense the temperature change.

Therefore, when a test is performed by applying a direct current, the heat value is inversely proportional to the total resistance, and therefore, only leakage defects which have a visible defect shape and through which a current of several nanoamperes or more flows can be detected.

Next, a case where a test signal having an alternating-current waveform is input to each auxiliary capacitor will be described.

As shown in FIG. 8, a short-circuit defect between a capacitor electrode and a capacitor line, and an interconnect resistance, are represented by an equivalent circuit in which a resistance R' is connected in series to a parallel CR circuit. Heat transformed from power consumption caused by current passage occurs at the resistance R of a short circuit (see Q in FIG. 8), the interconnect resistance R' (see Q' in FIG. 8), and the internal resistance component (negligible level) of the capacitance C. For a normal portion which does not have a leakage defect, it may be assumed that the boundary condition of the leakage resistance R is lim(R$^{-1} \to 0$), and the boundary condition is lim($\omega \to 0$) at an angular velocity $\omega(=2\pi f$ [f: frequency]) when a direct current is passed.

When a voltage E [$\sqrt{2}V_e \cos(\omega t)$] (effective voltage: $E_e$) is applied, power consumption $P_{Z'cr}$ is calculated from the complex impedance ($Z'_{CR}$) of this equivalent circuit by:

$$Z'_{CR} = R' + (R^{-1} + \omega Ci)^{-1}; \text{ and}$$

assuming that $x=\omega CR$ and $y=\omega CR' (>0)$, $$Z'_{CR}/R' = 1 + \{xy(1+x^{-2})\}^{-1} - \{y(1+x^{-2})\}^{-1}i$$

$$(|Z'_{CR}|/R')^2 = \{1+(x^{-1}+y^{-1})^2\}/(1+x^{-2})$$

$$\phi'_{CR} = \mathrm{Tan}^{-1}[-\{y(1+x^{-2})+x^{-1}\}^{-1}]$$

$$P_{Z'cr}(t) = E_e I_e \{\cos \phi'_{CR} + \cos(2\omega t + \phi'_{CR})\}$$

where $\omega$ is the angular velocity.

After time averaging, power consumption $P_{CR, R'}$ at the resistance R' is calculated to be $(E_e/|Z'_{CR}|)^2 R'$ under the current conditions, and power consumption $P_{CR, R}$ at the resistance R is calculated to be $(E_e - E_{e, CRR'})^2/R$ under the voltage division conditions.

Next, in a serial CR circuit corresponding to an equivalent circuit of a normal portion, the power consumption $P_{Z'c}$ is calculated from a complex impedance ($Z'_C$), assuming that the boundary condition is lim(R$^{-1} \to 0$) [i.e., lim(x$^{-1} \to 0$)], by:

$$Z'_C/R' = 1 - y^{-1}i$$

$$(|Z'_C|/R')^2 = 1 + y^{-2}$$

$$\phi'_C = \mathrm{Tan}^{-1}(-y^{-1})$$

$$P_{Z'C}(t) = E_e I_e \{\cos \phi'_C + \cos(2\omega t + \phi'_C)\}$$

Power consumption $P_{C, R'}$ at the resistance R' is $(E_e/|Z'_C|)^2 R'$ under the current conditions.

Thus, heat generation at the resistance R', which is not clearly observed in the presence of an applied direct current, can be clearly observed in the presence of an applied alternating current, i.e., can be detected using thermography.

The value of $|Z'_{CR}|/R'$ at the abnormal portion of the defective pixel and the value of $|Z'_C|/R'$ at the normal portion specifically vary as shown in Table 1 described below relative to the values of x (substituting as RC$\omega$)) and y (substituting as R'C$\omega$) described above. Here, when R>>R', as can be clearly seen from Table 1 if there is no difference in C and R' between the abnormal portion and the normal portion of the defective pixel, the influence of application of an alternating current on the leakage resistance R is less than that of application of a direct current.

TABLE 1

| Y\X | $\|Z'_C\|/R'$ — | $\|Z'_{CR}\|/R'$ | | | | | | |
|---|---|---|---|---|---|---|---|---|
| | | $1 \times 10^2$ | $1 \times 10^3$ | $1 \times 10^4$ | $1 \times 10^5$ | $1 \times 10^6$ | $1 \times 10^7$ | $1 \times 10^8$ |
| $1 \times 10^{-4}$ | $1.000 \times 10^4$ | $1.000 \times 10^4$ | $1.000 \times 10^4$ | $1.000 \times 10^4$ | $1.000 \times 10^4$ | $1.000 \times 10^4$ | $1.000 \times 10^4$ | $1.000 \times 10^4$ |
| $1 \times 10^{-3}$ | $1.000 \times 10^3$ | $1.000 \times 10^3$ | $1.000 \times 10^3$ | $1.000 \times 10^3$ | $1.000 \times 10^3$ | $1.000 \times 10^3$ | $1.000 \times 10^3$ | $1.000 \times 10^3$ |
| $1 \times 10^{-2}$ | $1.000 \times 10^2$ | $1.000 \times 10^2$ | $1.000 \times 10^2$ | $1.000 \times 10^2$ | $1.000 \times 10^2$ | $1.000 \times 10^2$ | $1.000 \times 10^2$ | $1.000 \times 10^2$ |
| $1 \times 10^{-1}$ | $1.005 \times 10^1$ | $1.006 \times 10^1$ | $1.005 \times 10^1$ | $1.005 \times 10^1$ | $1.005 \times 10^1$ | $1.005 \times 10^1$ | $1.005 \times 10^1$ | $1.005 \times 10^1$ |
| $1 \times 10^0$ | $1.414 \times 10^0$ | $1.421 \times 10^0$ | $1.415 \times 10^0$ | $1.414 \times 10^0$ | $1.414 \times 10^0$ | $1.414 \times 10^0$ | $1.414 \times 10^0$ | $1.414 \times 10^0$ |
| $1 \times 10^1$ | $1.005 \times 10^0$ | $1.006 \times 10^0$ | $1.005 \times 10^0$ | $1.005 \times 10^0$ | $1.005 \times 10^0$ | $1.005 \times 10^0$ | $1.005 \times 10^0$ | $1.005 \times 10^0$ |
| $1 \times 10^2$ | $1.000 \times 10^0$ | $1.000 \times 10^0$ | $1.000 \times 10^0$ | $1.000 \times 10^0$ | $1.000 \times 10^0$ | $1.000 \times 10^0$ | $1.000 \times 10^0$ | $1.000 \times 10^0$ |

Actually, some abnormality occurs in C or R' due to generation of a defect. The C or R' caused by the occurrence of the defect causes the value $y_{CR}$ of an abnormal portion of a defective pixel to be more or less different from the value $y_C$ of a normal portion. Table 2 shows the difference ratio $(1-y_{CR}/y_C)$ represented by α, and $|Z'_{CR}|/R'$ of an abnormal portion of a defective pixel and $|Z'_C|/R'$ of a normal portion relative to $y_C$.

insulating film being interposed therebetween, whereby a pair of auxiliary capacitors are formed. Here, in the pixel of FIG. 9, the short-circuit defect S occurs in the left-hand auxiliary capacitor. Therefore, the left-hand auxiliary capacitor can be regarded as a CR circuit in which a resistance is connected in series to the aforementioned parallel CR circuit.

Now, for example, the heat value of each resistance component is predicted, assuming that C=1 pF, R=1 TΩ, R'=1

| Y\α | $\|Z'_C\|/R'$ — | $\|Z'_{CR}\|/R': (X = 10^6)$ | | | | | | |
|---|---|---|---|---|---|---|---|---|
| | | −10% | −3% | 0% | 3% | 5% | 10% | 30% |
| $1 \times 10^{-4}$ | $1.000 \times 10^4$ | $9.091 \times 10^3$ | $9.709 \times 10^3$ | $1.000 \times 10^4$ | $1.031 \times 10^4$ | $1.053 \times 10^4$ | $1.111 \times 10^4$ | $1.429 \times 10^4$ |
| $1 \times 10^{-3}$ | $1.000 \times 10^3$ | $9.091 \times 10^2$ | $9.709 \times 10^2$ | $1.000 \times 10^3$ | $1.031 \times 10^3$ | $1.053 \times 10^3$ | $1.111 \times 10^3$ | $1.429 \times 10^3$ |
| $1 \times 10^{-2}$ | $1.000 \times 10^2$ | $9.091 \times 10^1$ | $9.709 \times 10^1$ | $1.000 \times 10^2$ | $1.031 \times 10^2$ | $1.053 \times 10^2$ | $1.111 \times 10^2$ | $1.429 \times 10^2$ |
| $1 \times 10^{-1}$ | $1.005 \times 10^1$ | $9.146 \times 10^0$ | $9.760 \times 10^0$ | $1.005 \times 10^1$ | $1.036 \times 10^1$ | $1.057 \times 10^1$ | $1.116 \times 10^1$ | $1.432 \times 10^1$ |
| $1 \times 10^0$ | $1.414 \times 10^0$ | $1.351 \times 10^0$ | $1.394 \times 10^0$ | $1.414 \times 10^0$ | $1.436 \times 10^0$ | $1.452 \times 10^0$ | $1.495 \times 10^0$ | $1.744 \times 10^0$ |
| $1 \times 10^1$ | $1.005 \times 10^0$ | $1.004 \times 10^0$ | $1.005 \times 10^0$ | $1.005 \times 10^0$ | $1.005 \times 10^0$ | $1.006 \times 10^0$ | $1.006 \times 10^0$ | $1.010 \times 10^0$ |
| $1 \times 10^2$ | $1.000 \times 10^0$ | $1.000 \times 10^0$ | $1.000 \times 10^0$ | $1.000 \times 10^0$ | $1.000 \times 10^0$ | $1.000 \times 10^0$ | $1.000 \times 10^0$ | $1.000 \times 10^0$ |

Table 3 (left column) shows the total impedance $|Z'_{CR}|$ and $\cos \phi'_{CR}$ of an abnormal portion of a defective pixel and the total impedance $|Z'_C|$ and $\cos \phi'_C$ of a normal portion specifically vary relative to the value of the angular velocity ω.

MΩ, and R"=250 kΩ. The heat value specifically varies relative to the value of the angular velocity ω as shown in the right-hand column of Table 3. Here, in Table 3, $P_{CR, R}$ is the heat value of the resistance R in the CR circuit of the short-

TABLE 3

| ω(2πf) | $\|Z'_C\|/M\Omega$ | $\cos(\phi'_C)$ — | $\|Z'_{CR}\|/M\Omega$ (α = 5%) | $\cos(\phi'_{CR})$ (α = 5%) | $PC_{C, R'}/\mu W$ ($E_{01}$ = 5 V) | $P_{CR, R'}/\mu W$ (α = 5%) | $P_{CR, R'}/\mu W$ | $P_{R''}/\mu W$ ($E_{02}$ = 2.5 V) |
|---|---|---|---|---|---|---|---|---|
| $1 \times 10^5$ | 10.0499 | 0.100 | 10.5737 | 0.095 | 0.124 | 0.112 | 0.0000102 | 0.124 |
| $2 \times 10^5$ | 5.0990 | 0.196 | 5.3573 | 0.187 | 0.481 | 0.436 | 0.0000083 | 0.481 |
| $3 \times 10^5$ | 3.4801 | 0.287 | 3.6485 | 0.274 | 1.032 | 0.939 | 0.0000066 | 1.032 |
| $5 \times 10^5$ | 2.2361 | 0.447 | 2.3307 | 0.429 | 2.500 | 2.301 | 0.0000041 | 2.500 |
| $1 \times 10^6$ | 1.4142 | 0.707 | 1.4519 | 0.689 | 6.250 | 5.930 | 0.0000012 | 6.250 |
| $2 \times 10^6$ | 1.1180 | 0.894 | 1.1300 | 0.885 | 10.000 | 9.788 | 0.0000002 | 10.000 |
| $3 \times 10^6$ | 1.0541 | 0.949 | 1.0598 | 0.944 | 11.250 | 11.130 | 0.0000000 | 11.250 |
| $5 \times 10^6$ | 1.0198 | 0.981 | 1.0219 | 0.979 | 12.019 | 11.969 | 0.0000000 | 12.019 |
| $1 \times 10^7$ | 1.0050 | 0.995 | 1.0055 | 0.995 | 12.376 | 12.363 | 0.0000000 | 12.376 |
| $2 \times 10^7$ | 1.0012 | 0.999 | 1.0014 | 0.999 | 12.469 | 12.465 | 0.0000000 | 12.469 |
| $3 \times 10^7$ | 1.0006 | 0.999 | 1.0006 | 0.999 | 12.486 | 12.485 | 0.0000000 | 12.486 |
| $5 \times 10^7$ | 1.0002 | 1.000 | 1.0002 | 1.000 | 12.495 | 12.494 | 0.0000000 | 12.495 |
| $1 \times 10^8$ | 1.0000 | 1.000 | 1.0001 | 1.000 | 12.499 | 12.499 | 0.0000000 | 12.499 |

FIG. 9 is a partially enlarged view of a pixel in which a short-circuit defect S has occurred in an auxiliary capacitor. FIG. 10 is an equivalent circuit diagram of the pixel. Here, for example, when there are two separated capacitor electrodes, then if R'>4R", heat generation at R' is dominant over that at R", whereby the detection sensitivity can be enhanced.

In each pixel, as shown in FIG. 9, the drain region of the semiconductor layer 12 is divided or branched in a region which overlaps the capacitor line 14b, to form a pair of capacitor electrodes 12da and 12db. The capacitor electrodes 12da and 12db overlap the capacitor line 14b with a gate circuited auxiliary capacitor, $P_{CR, R'}$ is the heat value of the resistance R' connected in series to the CR circuit of the short-circuited auxiliary capacitor, $P_{C, R'}$ is the heat value of the resistance R' connected in series to the non-short-circuited auxiliary capacitor, and $P_{R''}$ is the heat value of the resistance R" before the drain region of the semiconductor layer 12 is branched.

A change in temperature in a plate-like electrical heater (see FIG. 11) as a heat generation source is represented by the following expression, assuming that generated heat is transferred downward.

$$C_v(T) Sx\Delta T = \int \{(P_{C,R'}) - S\kappa \cdot \partial \Delta T/\partial x\} dt$$

Here, when R'=1 MΩ and C=1 pF, $P_{C,R'}$=6.25 µW based on $|Z'_C|=\sqrt{2}$ MΩ, assuming that y=1.

The transfer of heat through a plane $d_1$ located at a distance d from a heat generation source $d_0$ is approximated by heat balance calculation using a finite difference method represented by the following expression, and the law of conservation of energy:

$$\Delta Q_{d1}=C_v(S \cdot x)\Delta T1=\kappa_{SiO2}S\{(\Delta T_2+\Delta T_0-2\Delta T_1)/x\}\partial t$$

$$\Delta Q_{all}=C_v S\int\Delta T\partial x=\int P\partial t(x=0 \text{ to } \infty)$$

where $\kappa_{SiO2}$ (1.2 Wm⁻¹ K⁻¹) is the thermal diffusion coefficient of $SiO_2$, S (80 µm²) is the cross-section of a window of diffused heat flux, $C_v$ (1.66 Jcm⁻³K⁻¹) is the heat capacity at constant volume of thin film Si.

FIG. 12 shows an example result obtained by simulation using a finite difference method. As can be predicted from a temperature distribution caused by heat generation, heat is instantaneously transferred in the vicinity (within a distance of about 7 µm) of a heat source, the average temperature gradient tends to be 0.04 Kµm⁻¹, and heat is attenuated in inverse proportion to the square of the distance from the heat source within the distance range of more than about 30 µm.

Actually, as shown in FIG. 13, the temperature change ΔT in the heater varies while heating and cooling (thermal diffusion) are alternately repeated, where heat is generated by current passage for a period $\Delta t_{gate,on}$ in which the gate is open. The time constant of temperature measurement is longer than a gate period $T_G$, and therefore, averaging may be performed. As shown in Table 4 below, simulation which is performed for a high-resolution liquid crystal panel in which the number of gate lines is 400, shows that the temperature increases while the rate of the temperature increase gradually decreases, e.g., 0.16 K at 1.2 sec, 0.53 K at 12 sec, and 1.2 K at 60 sec. Note that the period $T_G$ (see FIG. 13) of a scanning test signal input to the gate line is set apart from the angular velocity ω of an alternating-current voltage applied to promote heat generation.

It is predicted that the tendency of the temperature increase of each resistance component in an abnormal pixel varies as shown in Table 4 below which contains specific simulation results. As the angular velocity ω is gradually shifted toward a high frequency region, the heat value increases. However, it is observed that the difference between heat generation between a normal portion and an abnormal portion of a defective pixel tends to decrease when the angular velocity in is a predetermined frequency (called a cut-off frequency) or more.

TABLE 4

| | t/s | 1.2 | 3 | 6 | 12 | 24 | 36 | 60 |
|---|---|---|---|---|---|---|---|---|
| $\Delta T_{C,R'}$/K | ω = 10⁵ rads⁻¹ | 0.003 | 0.005 | 0.007 | 0.010 | 0.015 | 0.018 | 0.024 |
| $\Delta T_{CR,R'\ 5\%}$/K | (α = 5%) | 0.003 | 0.005 | 0.007 | 0.009 | 0.013 | 0.017 | 0.021 |
| $\Delta T_{C,R'}$/K | ω = 2*10⁵ rads⁻¹ | 0.012 | 0.020 | 0.029 | 0.041 | 0.058 | 0.071 | 0.092 |
| $\Delta T_{CR,R'\ 5\%}$/K | (α = 5%) | 0.011 | 0.018 | 0.026 | 0.037 | 0.052 | 0.064 | 0.083 |
| $\Delta T_{C,R'}$/K | ω = 3*10⁵ rads⁻¹ | 0.026 | 0.043 | 0.061 | 0.087 | 0.124 | 0.153 | 0.198 |
| $\Delta T_{CR,R'\ 5\%}$/K | (α = 5%) | 0.024 | 0.039 | 0.056 | 0.080 | 0.113 | 0.139 | 0.180 |
| $\Delta T_{C,R'}$/K | ω = 5*10⁵ rads⁻¹ | 0.026 | 0.043 | 0.061 | 0.087 | 0.124 | 0.153 | 0.198 |
| $\Delta T_{CR,R'\ 5\%}$/K | (α = 5%) | 0.024 | 0.039 | 0.056 | 0.080 | 0.113 | 0.139 | 0.180 |
| $\Delta T_{C,R'}$/K | ω = 10⁶ rads⁻¹ | 0.160 | 0.259 | 0.371 | 0.529 | 0.753 | 0.925 | 1.198 |
| $\Delta T_{CR,R'\ 5\%}$/K | (α = 5%) | 0.152 | 0.246 | 0.352 | 0.502 | 0.714 | 0.878 | 1.136 |
| $\Delta T_{C,R'}$/K | ω = 2*10⁶ rads⁻¹ | 0.256 | 0.415 | 0.593 | 0.847 | 1.205 | 1.480 | 1.916 |
| $\Delta T_{CR,R'\ 5\%}$/K | (α = 5%) | 0.251 | 0.406 | 0.581 | 0.829 | 1.179 | 1.449 | 1.876 |
| $\Delta T_{C,R'}$/K | ω = 3*10⁶ rads⁻¹ | 0.288 | 0.466 | 0.668 | 0.952 | 1.356 | 1.665 | 2.156 |
| $\Delta T_{CR,R'\ 5\%}$/K | (α = 5%) | 0.285 | 0.461 | 0.660 | 0.942 | 1.341 | 1.647 | 2.132 |
| $\Delta T_{C,R'}$/K | ω = 2*10⁶ rads⁻¹ | 0.308 | 0.498 | 0.713 | 1.018 | 1.448 | 1.779 | 2.303 |
| $\Delta T_{CR,R'\ 5\%}$/K | (α = 5%) | 0.307 | 0.496 | 0.710 | 1.013 | 1.442 | 1.771 | 2.293 |
| $\Delta T_{C,R'}$/K | ω = 10⁷ rads⁻¹ | 0.317 | 0.513 | 0.734 | 1.048 | 1.491 | 1.832 | 2.371 |
| $\Delta T_{CR,R'\ 5\%}$/K | (α = 5%) | 0.317 | 0.513 | 0.734 | 1.047 | 1.490 | 1.830 | 2.369 |
| $\Delta T_{C,R'}$/K | ω = 10⁸ rads⁻¹ | 0.320 | 0.518 | 0.742 | 1.058 | 1.506 | 1.850 | 2.395 |
| $\Delta T_{CR,R'\ 5\%}$/K | (α = 5%) | 0.320 | 0.518 | 0.742 | 1.058 | 1.506 | 1.850 | 2.395 |

As described above, in the short-circuit defect S accompanied by minute leakage between the capacitor line and the capacitor electrode, if a direct-current voltage is applied, weak heat generation which cannot be thermally detected occurs only at the short-circuit portion. However, by applying an alternating current having an appropriate frequency, a change occurs in the manner of the flow of a current in the entire circuit. For example, when ω/rads⁻¹ is set to 10⁶ so that y≈1, a current flows through a resistance R' connected to a non-short-circuited auxiliary capacitor in addition to a resistance R' connected in series to a short-circuited auxiliary capacitor, and the difference in heat generation between these resistances R' is maximized due to a minute difference in cut-off conditions. Specifically, as shown in FIG. 14, when the α is 5%, the temperature difference between the branch portions of the semiconductor layer 12 (see Q' in FIG. 14) is 8 mK after 1 sec, 27 mK after 12 sec, and 62 mK after 60 sec. Based on a temperature distribution obtained in this case, a position of a short-circuit defect in a defective pixel can be identified to determine a target to be repaired.

The device may further include a defect repairer configured to repair the short-circuit defect identified by the defect position identifier, by irradiation with laser light.

With the above configuration, the device includes a defect repairer configured to repair a short-circuit defect by irradiation with laser light. Therefore, in the defect repairer, a short-circuit defect identified by the defect position identifier can be specifically repaired.

The defect position identifier may include a first objective lens for far-infrared light. The defect repairer may include a second objective lens for laser light. The first and second objective lenses may be switched in a sliding manner at a position away from the stage.

With the above configuration, the first objective lens for far-infrared light of the defect position identifier and the second objective lens for laser light of the defect repairer can be switched in a sliding manner at a position away from the stage. Therefore, a lens displacement which occurs when the first objective lens is switched to the second objective lens can be reduced, whereby the short-circuit defect whose position has been identified by the defect position identifier can be quickly and reliably repaired by the defect repairer.

A method for manufacturing an active matrix substrate including a plurality of pixels arranged in a matrix, according to the present invention, in which a short-circuit defect in the active matrix substrate is detected and repaired, includes a defective pixel detection step of inputting a test signal to a test substrate which will become the active matrix substrate, and electrically detecting coordinates of a defective pixel in which a short-circuit defect has occurred, and a defect position identification step of inputting the test signal to the test substrate to cause the defective pixel detected in the defective pixel detection step to generate heat, and sensing the heat generation in the defective pixel using far-infrared thermography, thereby identifying a position of the short-circuit defect in the defective pixel.

With the above method, in the defective pixel detection step, by inputting a test signal to the test substrate, the signal (source) line number and scanning (gate) line number of a defective pixel having a short-circuit defect are determined, whereby the coordinates of the defective pixel in the test substrate are found, for example. Thereafter, in the defect position identification step, by inputting a test signal to the test substrate again, the defective pixel is caused to generate heat, and the heat generation in the defective pixel at the coordinate point found by the defective pixel detection step is sensed using far-infrared thermography, whereby the position of the short-circuit defect in the defective pixel is identified. In this case, according to Wien's displacement law, the peak wavelength of radiation at room temperature is 9 μm, and therefore, the heat generation caused by the short-circuit defect in the defective pixel is sensed by far-infrared thermography with higher sensitivity than when near-infrared thermography is used, which is expected to be used in the test method described in PATENT DOCUMENT 1. Therefore, the position of the short-circuit defect in the defective pixel can be identified as easily as possible.

The method may further include a defect repairing step of repairing the short-circuit defect identified in the defect position identification step, by irradiation with laser light.

With the above method, the method includes a defect repairing step of repairing a short-circuit defect by irradiation with laser light. Therefore, in the defect repairing step, a short-circuit defect identified in the defect position identification step can be specifically repaired.

The test substrate may include a plurality of capacitor lines arranged in parallel with each other, a thin film transistor for each of the pixels, and a plurality of separated capacitor electrodes for each of the pixels, where the plurality of separated capacitor electrodes for each of the pixels overlap the corresponding capacitor line with an insulating film being interposed therebetween and are connected to the corresponding thin film transistor. The defective pixel detection step may detect a short-circuit defect between each of the capacitor lines and the corresponding plurality of capacitor electrodes. The defect repairing step may disconnect the connection between at least one of the plurality of capacitor electrodes corresponding to the position of the short-circuit defect identified in the defect position identification step, and the corresponding thin film transistor.

With the above method, in each pixel of the test substrate, a plurality of separated auxiliary capacitors include a capacitor line, a plurality of separated capacitor electrodes, and an insulating film therebetween. In the defective pixel detection step, a defective pixel in which a short-circuit defect has occurred between the corresponding capacitor line and separated capacitor electrodes is detected. In the defect position identification step, the defective pixel detected in the defective pixel detection step is caused to generate heat, and the heat generation is sensed using far-infrared thermography, thereby identifying the position of the short-circuit defect in the defective pixel. In the defect repairing step, at least one of the separated capacitor electrodes that corresponds to the position of the short-circuit defect identified in the defect position identification step is cut off from the thin film transistor. As a result, the operation and advantages of the present invention can be specifically achieved.

The test substrate may be a substrate on which a plurality of pixel electrodes, and an insulating film below the pixel electrodes, have not yet been formed.

With the above method, the test substrate is a substrate on which a plurality of pixel electrodes, and an insulating film below the pixel electrodes, have not yet been formed. Therefore, after the defect repairing step is performed, the pixel electrodes and the insulating film below the pixel electrodes are formed. Therefore, holes resulting from repairing by irradiation with laser light, abnormalities in the surface state, etc. in the surface of the active matrix substrate are filled or buried and flattened by formation of an insulating film performed in a subsequent step, whereby the active matrix substrate has as flat a surface as that which is obtained by a commonly used manufacturing method. As a result, in a liquid crystal display panel including the active matrix substrate, the disturbance of alignment of the liquid crystal layer at the laser repaired portion is reduced, resulting in defect repairing which can maintain high display quality without light leakage which would be induced by repairing.

The test substrate may include a plurality of capacitor lines arranged in parallel with each other, a thin film transistor for each of the pixels, and a plurality of separated capacitor electrodes for each of the pixels, where the plurality of separated capacitor electrodes for each of the pixels overlap the corresponding capacitor line with an insulating film being interposed therebetween and are connected to the corresponding thin film transistor. In each of the pixels, the plurality of capacitor electrodes may each form an auxiliary capacitor having a capacitance C, and an interconnect having a resistance R' is connected in series to each of the auxiliary capacitors. In the defect position identification step, a high frequency signal having an angular velocity ω may be input to the plurality of auxiliary capacitors of each of the pixels, where ωCR' is 0.1-10, preferably 0.3-3.

Here, FIG. 15 is a graph showing a relationship between a heat value P and a frequency (angular velocity ω) in the resistance R' connected in series to the pair of auxiliary capacitors. In the active matrix substrate, if the angular velocity ω (2πf) of the high frequency signal is increased, the heat generation caused by the resistance inside the pixel becomes significant. As shown in FIG. 15, the difference (difference value) between the normal portion ($P_{C, R'}$) and the abnormal portion ($P_{CR, R'}$) decreases within the angular velocity range of more than about the cut-off frequency (y (=ωCR')=1). As can be seen from FIG. 15 and Table 4, the temperature difference can be detected for a minimum of about 1 nW. Therefore, if the angular velocity of the input high frequency signal is 0.1-10 times as high as the cut-off frequency, a short-circuited auxiliary capacitor is detected, and a position of a short-circuit defect in a defective pixel is reliably identified. Note that if the angular velocity of the input high frequency signal is 0.3-3 times as high as the cut-off frequency, a position of a short-circuit defect in a defective pixel is more reliably identified.

A device for manufacturing a display panel including a plurality of pixels arranged in a matrix, according to the present invention, in which a short-circuit defect in the display panel is detected and repaired, includes a stage configured to place a test panel which will become the display panel, a defective pixel detector configured to input a test signal to the test panel placed on the stage, and optically detect coordinates of a defective pixel in which a short-circuit defect has occurred, and a defect position identifier configured to input the test signal to the test panel placed on the stage to cause the defective pixel detected by the defective pixel detector to generate heat, and sense the heat generation in the defective pixel using far-infrared thermography, thereby identifying a position of the short-circuit defect in the defective pixel.

With the above configuration, in the defective pixel detector, by inputting a test signal to the test panel, the signal (source) line number and scanning (gate) line number of a defective pixel having a short-circuit defect are determined, whereby the coordinates of the defective pixel in the test panel are found, for example. Thereafter, in the defect position identifier, by inputting a test signal to the test panel again, the defective pixel is caused to generate heat, and the heat generation in the defective pixel at the coordinate point found by the defective pixel detector is sensed using far-infrared thermography, whereby the position of the short-circuit defect in the defective pixel is identified. In this case, according to Wien's displacement law, the peak wavelength of radiation at room temperature is 9 µm, and therefore, the heat generation caused by the short-circuit defect in the defective pixel is sensed by far-infrared thermography with higher sensitivity than when near-infrared thermography is used, which is expected to be used in the test method described in PATENT DOCUMENT 1. Therefore, the position of the short-circuit defect in the defective pixel can be identified as easily as possible.

A method for manufacturing a display panel including a plurality of pixels arranged in a matrix, according to the present invention, in which a short-circuit defect in the display panel is detected and repaired, includes a defective pixel detection step of inputting a test signal to a test panel which will become the display panel, and optically detect coordinates of a defective pixel in which a short-circuit defect has occurred, and a defect position identification step of inputting the test signal to the test panel to cause the defective pixel detected in the defective pixel detection step to generate heat, and sensing the heat generation in the defective pixel using far-infrared thermography, thereby identifying a position of the short-circuit defect in the defective pixel.

With the above method, in the defective pixel detection step, by inputting a test signal to the test panel, the signal (source) line number and scanning (gate) line number of a defective pixel having a short-circuit defect are determined, whereby the coordinates of the defective pixel in the test panel are found, for example. Thereafter, in the defect position identification step, by inputting a test signal to the test panel again, the defective pixel is caused to generate heat, and the heat generation in the defective pixel at the coordinate point found by the defective pixel detection step is sensed using far-infrared thermography, whereby the position of the short-circuit defect in the defective pixel is identified. In this case, according to Wien's displacement law, the peak wavelength of radiation at room temperature is 9 µm, and therefore, the heat generation caused by the short-circuit defect in the defective pixel is sensed by far-infrared thermography with higher sensitivity than when near-infrared thermography is used, which is expected to be used in the test method described in PATENT DOCUMENT 1. Therefore, the position of the short-circuit defect in the defective pixel can be identified as easily as possible.

Advantages of the Invention

According to the present invention, after coordinates of a defective pixel are detected, a test signal is input to a test substrate or a test panel to cause the defective pixel to generate heat, and the heat generation in the defective pixel is sensed using far-infrared thermography, thereby identifying a position of a short-circuit defect causing the defective pixel. Therefore, the position of the short-circuit defect in the defective pixel can be identified as easily as possible.

BRIEF DESCRIPTION OF THE DRAWINGS

FIG. 2 is a plan view of an active matrix substrate 20a manufactured using the substrate repairing device 80a.

FIG. 4 is a flowchart showing a method for manufacturing the active matrix substrate 20a using the substrate repairing device 80a.

DESCRIPTION OF EMBODIMENTS

Embodiments of the present invention will be described in detail hereinafter with reference to the accompanying drawings. Note that the present invention is not intended to be limited to the embodiments described below.

First Embodiment of the Invention FIGS. 1-4 show a device and method for manufacturing an active matrix substrate according to a first embodiment of the present invention.

Figure 1:
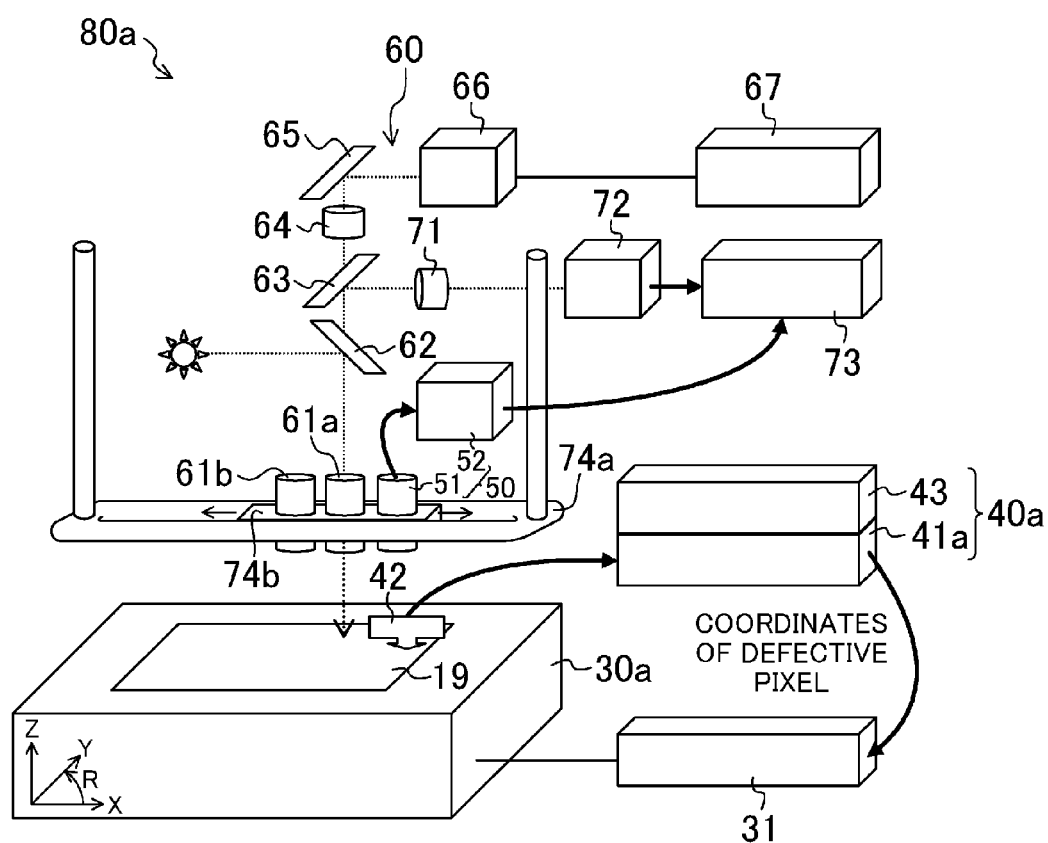
FIG. 1 is a perspective view of a substrate repairing device 80a according to a first embodiment.

Specifically, FIG. 1 is a perspective view of a substrate repairing device 80a of this embodiment.

As shown in FIG. 1, the substrate repairing device 80a includes a stage 30a for placing a substrate to be tested (hereinafter referred to as a test substrate) 19 which will become an active matrix substrate described below, a defective pixel detector 40a for inputting, to the test substrate 19 placed on the stage 30a, a test signal for actually driving the test substrate 19 to electrically detect coordinates of a defective pixel in which a short-circuit defect has occurred, a defect position identifier 50 for inputting, to the test substrate 19 placed on the stage 30a, a test signal for actually driving the test substrate 19 to cause a defective pixel to generate heat, and identify a short-circuit position in the defective pixel, and a defect repairer 60 for repairing a short-circuit defect identified by the defect position identifier 50, by irradiation with laser light.

As shown in FIG. 1, the stage 30a is connected to a stage controller 31, and can be appropriately moved in the X-axis direction, Y-axis direction, Z-axis direction, and R-axis direction (the rotational axis of the stage) while the test substrate 19 is placed on an upper surface thereof.

As shown in FIG. 1, the defective pixel detector 40a includes a prober 42 for inputting a test signal to the test substrate 19, an array testing device 41a for accessing TFTs in the pixels of the test substrate 19 to write charge to the auxiliary capacitors of the pixels, and thereafter, reading the charge written in the auxiliary capacitors to detect the presence or absence of a short-circuit defect in each pixel, thereby finding coordinates of a defective pixel and supplying the coordinates of the defective pixel in the test substrate 19 to the stage controller 31, and a high frequency signal generator 43 for generating a high frequency test signal which is to be input from the array testing device 41a to the test substrate 19.

As shown in FIG. 1, the defect position identifier 50 includes a first objective lens 51 for infrared light which faces the test substrate 19 and is made of Si, Ge, etc., and a sensor 52 for sensing a defective pixel in the test substrate 19 using thermography. A thermogram taken by the sensor 52 can be observed using a monitor 73.

As shown in FIG. 1, the defect repairer 60 includes a second objective lens 61a for visual observation which faces the test substrate 19 and has a relatively low magnification factor, a second objective lens 61b for visual observation and laser repairing which faces the test substrate 19 and has a relatively high magnification factor, a laser light source 66 for oscillating and supplying laser light, a mirror 62, a mirror 63, a lens 64, and a mirror 65 which are successively provided between the second objective lenses 61a and 61b and the laser light source 66, and a laser power supply 67 connected to the laser light source 66. Here, as shown in FIG. 1, a photodetector 72 is connected via a lens 71 to the mirror 63 so that images of a surface of the test substrate 19 before and after defect repairing can be observed and recorded via the monitor 73.

As shown in FIG. 1, the first objective lens 51 and the second objective lenses 61a and 61b are fixed to a slide section 74b which is attached to an elongated frame-like guide rail 74a in a manner which allows the slide section 74b can be translated.

Figure 2:
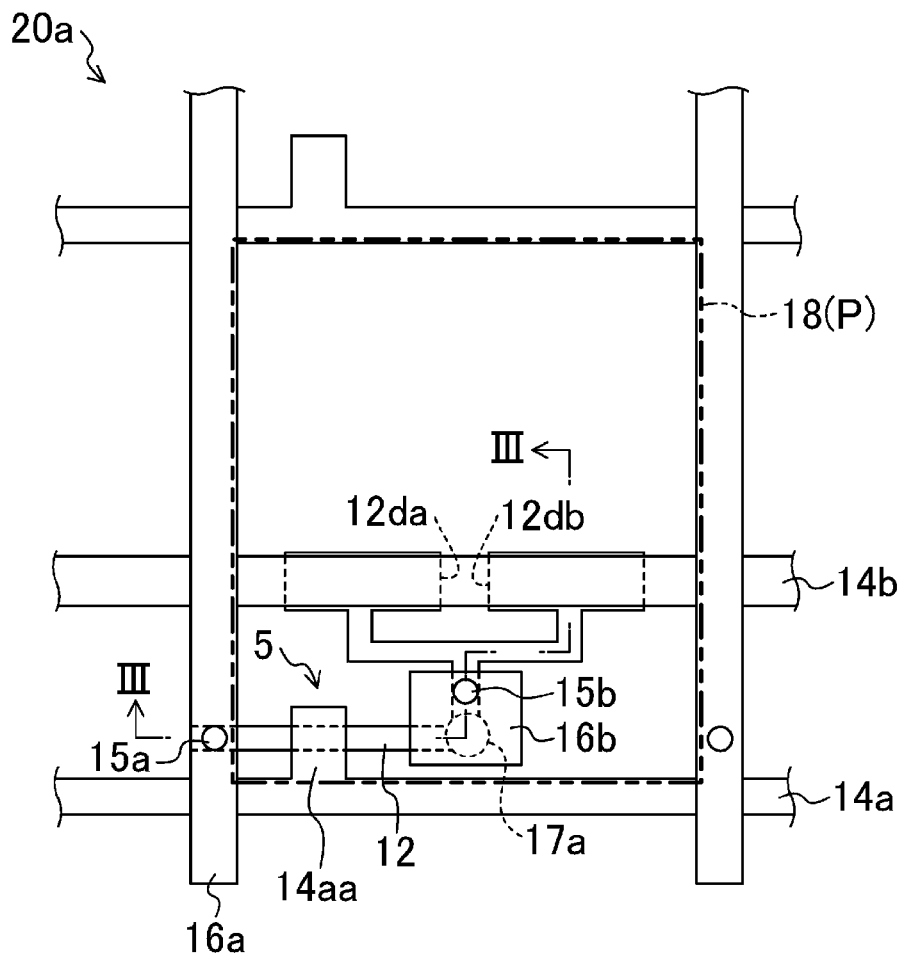
Figure 3:
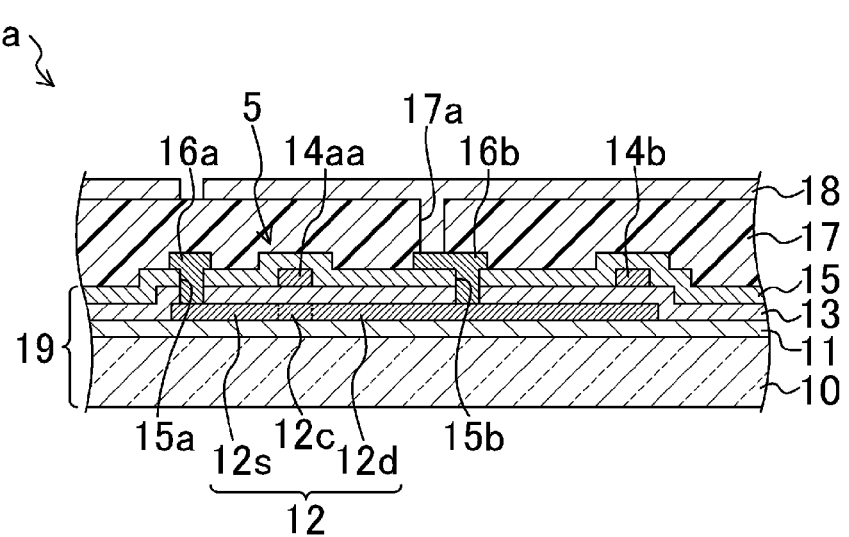
FIG. 3 is a cross-sectional view of the active matrix substrate 20a, taken along line III-III of FIG. 2.

Next, the test substrate 19 and an active matrix substrate 20a produced from the test substrate 19 will be described. Here, FIG. 2 is a plan view of the active matrix substrate 20a manufactured using the substrate repairing device 80a. FIG. 3 is a cross-sectional view of the active matrix substrate 20a, taken along line III-III of FIG. 2.

As shown in FIGS. 2 and 3, the active matrix substrate 20a includes a plurality of pixel electrodes 18 arranged in a matrix, a plurality of gate lines 14a arranged in parallel with each other and along upper and lower sides of the corresponding pixel electrodes 18, a plurality of source lines 16a arranged in parallel with each other and along left and right sides of the corresponding pixel electrodes 18, a plurality of capacitor lines 14b arranged in parallel with each other and between the corresponding gate lines 14a, and TFTs 5 one or more of which correspond to each pixel electrode 18.

As shown in FIGS. 2 and 3, the TFT 5 includes a semiconductor layer 12 provided on an insulating substrate 10 with a base coat layer 11 being interposed therebetween, a gate insulating film 13 covering the semiconductor layer 12, a gate electrode 14aa provided on the gate insulating film 13, a first interlayer insulating film 15 covering the gate electrode 14aa, and a source electrode (source line 16a) and a drain electrode 16b which are provided on the first interlayer insulating film 15. As shown in FIG. 3, a second interlayer insulating film 17 is provided on the first interlayer insulating film 15, covering the source electrode (source line 16a) and the drain electrode 16b. Here, as shown in FIGS. 2 and 3, the gate electrode 14aa is a portion of the gate line 14a which protrudes sideways in each pixel P and overlaps a channel region 12c of the semiconductor layer 12. As shown in FIGS. 2 and 3, the source electrode is a portion of the source line 16a, and is connected to a source region 12s of the semiconductor layer 12 via a contact hole 15a formed in the multilayer film of the gate insulating film 13 and the first interlayer insulating film 15. As shown in FIGS. 2 and 3, the drain electrode 16b is connected to a drain region 12d of the semiconductor layer 12 via a contact hole 15b formed in the multilayer film of the gate insulating film 13 and the first interlayer insulating film 15, and is also connected to the pixel electrode 18 via a contact hole 17a formed in the second interlayer insulating film 17. The drain region 12d of the semiconductor layer 12 has a pair of capacitor electrodes 12da and 12db (e.g., two separated capacitor electrodes shown in FIG. 2). The capacitor electrodes 12da and 12db overlap the capacitor line 14b with the gate insulating film 13 being interposed therebetween, whereby a pair of auxiliary capacitors are formed.

As shown in FIG. 3, the test substrate 19 is the active matrix substrate 20a on which the second interlayer insulating film 17 and the pixel electrodes 18 have not yet been formed.

Figure 4:
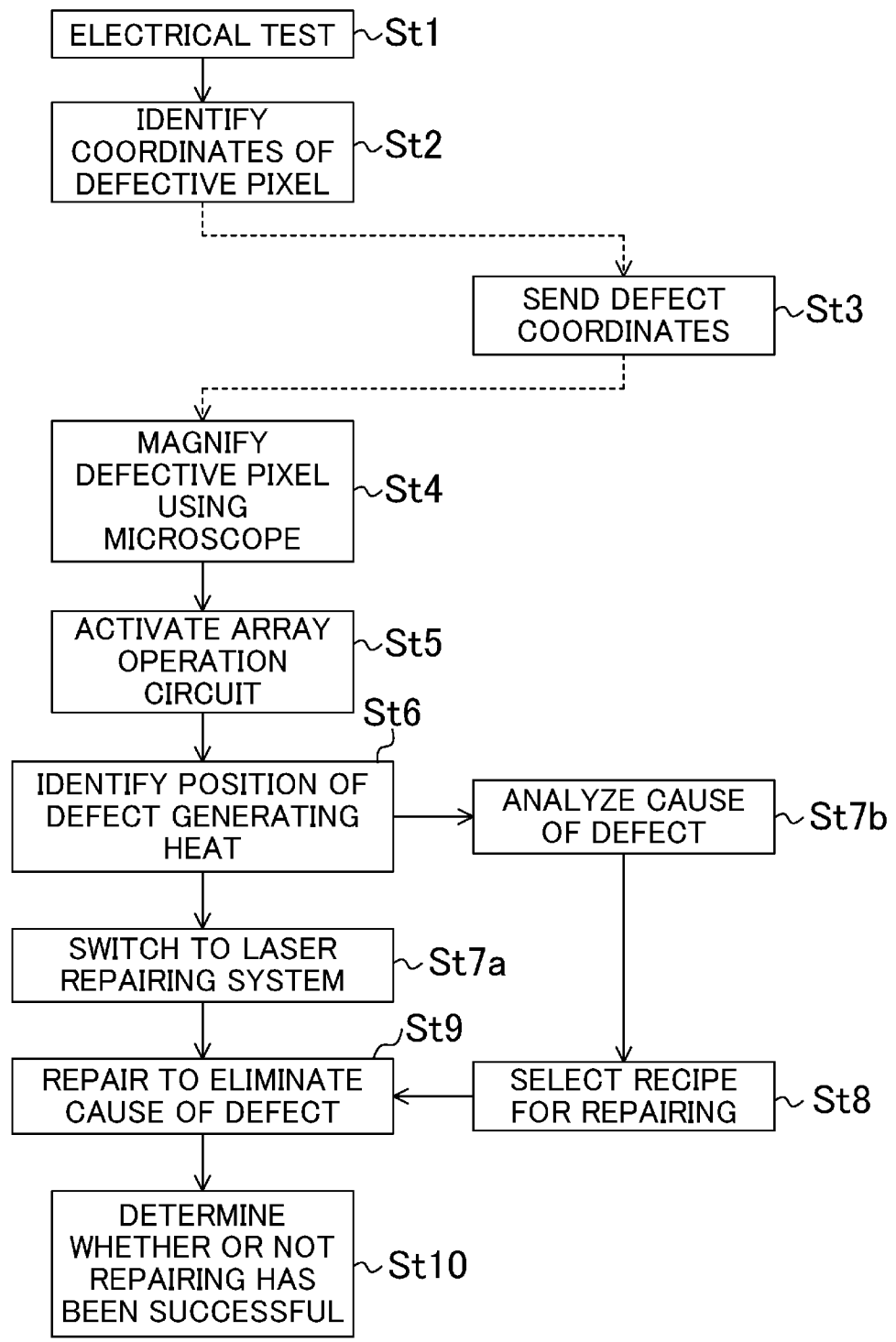

Next, a method for manufacturing the active matrix substrate 20a using the substrate repairing device 80a having the above configuration will be described. Here, FIG. 4 is a flowchart showing the method for manufacturing the active matrix substrate 20a using the substrate repairing device 80a. Note that the manufacturing method of this embodiment includes a preparation step of preparing the test substrate 19, a defective pixel detection step of detecting coordinates of a defective pixel in which a short-circuit defect has occurred, a defect position identification step of identifying a position of a short-circuit defect in a defective pixel, a defect repairing step of repairing a short-circuit defect, and a pixel electrode formation step of forming a pixel electrode in the test substrate 19.

<Preparation Step>

Initially, for example, a silicon oxide film etc. is formed on the entire insulating substrate 10, such as a glass substrate etc., by plasma-enhanced chemical vapor deposition (CVD), to form the base coat layer 11.

Next, an amorphous silicon film is formed on the entire substrate on which the base coat layer 11 has been formed, by plasma-enhanced CVD using disilane etc. as a material gas. Thereafter, the amorphous silicon film is crystallized and transformed into a polysilicon film by irradiation with high-power pulsed laser light, heating, etc. Thereafter, the polysilicon film is patterned by photolithography to form the semiconductor layer 12.

Moreover, for example, a silicon oxide film etc. is formed on the entire substrate on which the semiconductor layer 12 has been formed, by plasma-enhanced CVD, to form the gate insulating film 13.

Thereafter, for example, a tungsten film etc. is formed on the entire substrate on which the gate insulating film 13 has been formed, by sputtering, and then patterned by photolithography, to form the gate line 14a, the gate electrode 14aa, and the capacitor line 14b.

Next, phosphorus or boron ions are implanted via the gate insulating film 13 into the semiconductor layer 12 using an ion doping device with the gate electrode 14aa as a mask, to form the channel region 12c at a portion overlapping the gate electrode 14aa, and the source region 12s and the drain region 12d outside that portion. Thereafter, heating is performed to activate the implanted phosphorus or boron.

Moreover, for example, a silicon oxide film etc. is formed on the entire substrate on which the gate line 14a, the gate electrode 14aa, and the capacitor line 14b have been formed, by plasma-enhanced CVD, to form the first interlayer insulating film 15.

Thereafter, the multilayer film of the second gate insulating film 13 and the first interlayer insulating film 15 is partially removed by etching to form the contact holes 15a and 15b.

Thereafter, for example, a titanium film, an aluminum film, and a titanium film are successively formed on the entire substrate, i.e., the first interlayer insulating film 15, by sputtering, and then patterned by photolithography, to form the source line (source electrode 16a) and the drain electrode 16b.

Moreover, heating is performed to hydrogenate the semiconductor layer 12, thereby terminating the dangling bonds.

Thus, the test substrate 19 can be prepared.

<Defective Pixel Detection Step>

Initially, the test substrate 19 prepared in the preparation step is placed on the stage 30a of the substrate repairing device 80a.

Figure 9:
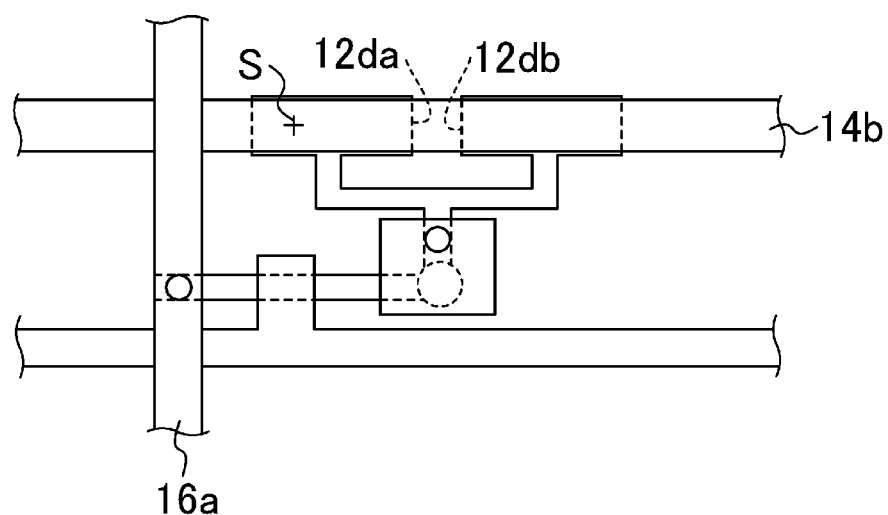
FIG. 9 is a partially enlarged view of a pixel in which a short-circuit defect S has occurred in one of auxiliary capacitors.
Figure 10:
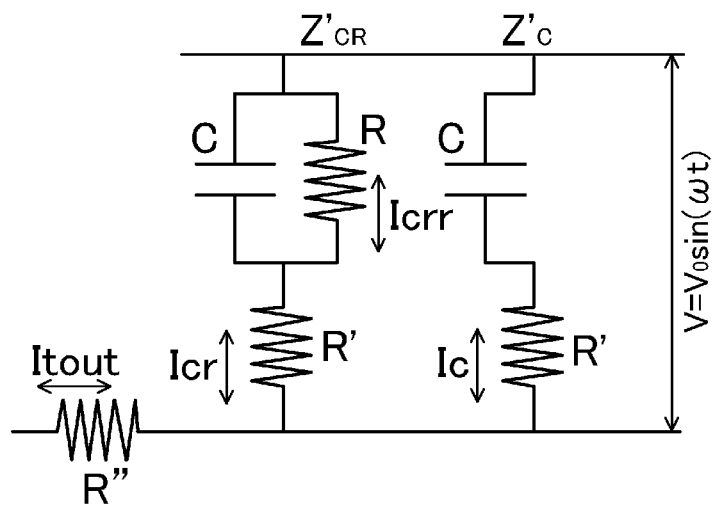
FIG. 10 is a diagram showing an equivalent circuit of a pixel in which a short-circuit defect S has occurred in one of auxiliary capacitors.
Figure 11:
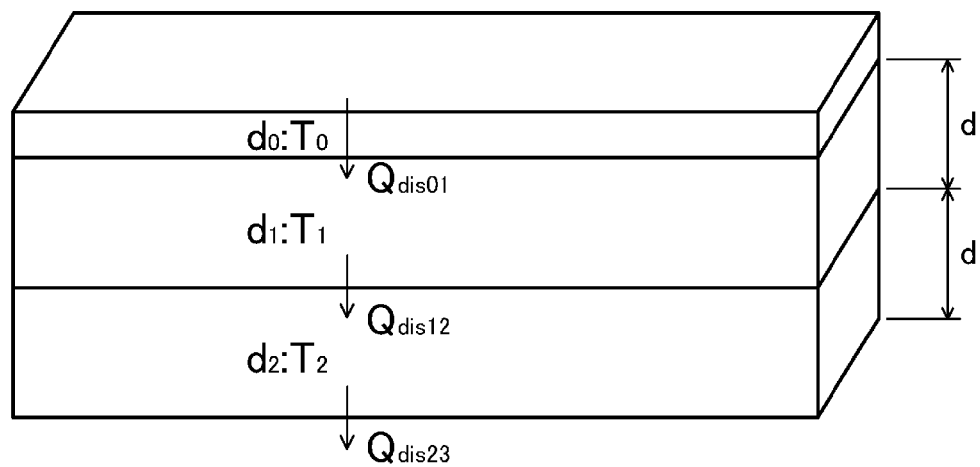
FIG. 11 is a perspective view schematically showing propagation of heat from a plate-like heat source.
Figure 12:
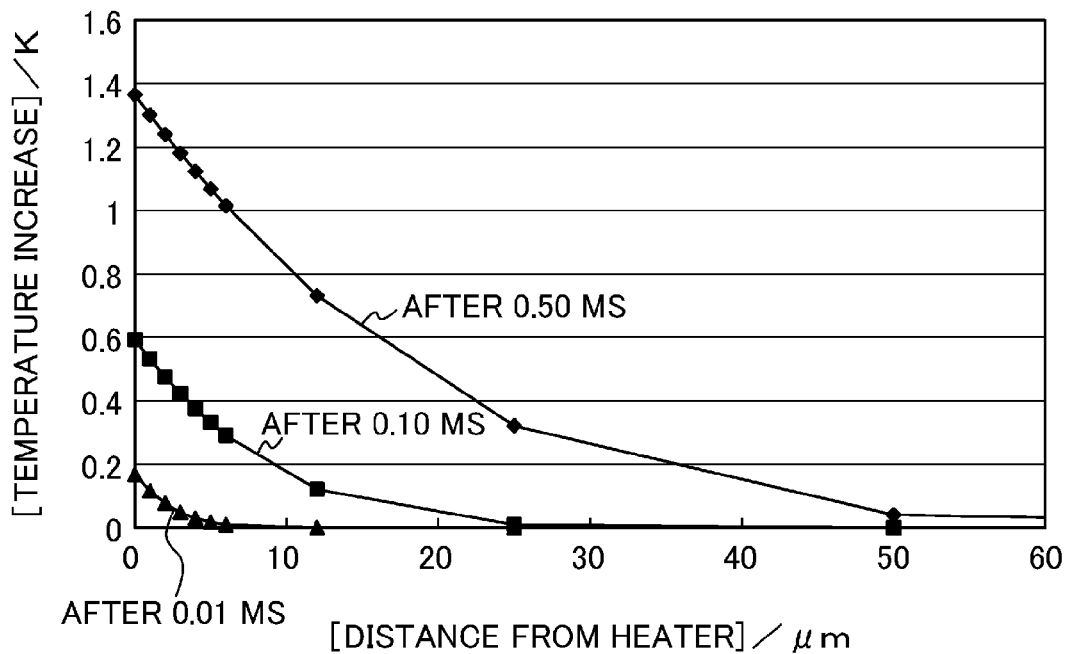
FIG. 12 is a graph showing the result of simulation of a relationship between the distance from a heat source and the temperature increase using a finite difference method.
Figure 13:
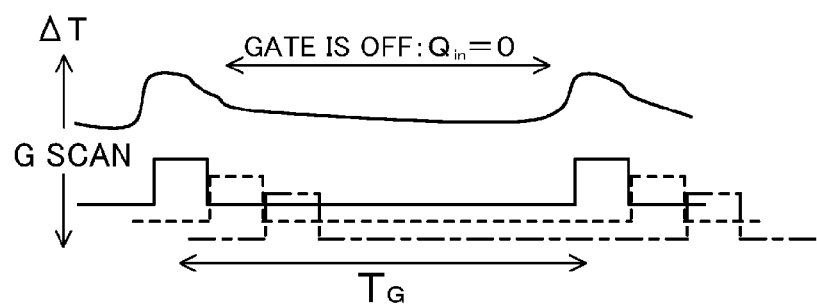
FIG. 13 is a diagram schematically showing a relationship between the timing of inputting a scanning signal to a gate line of a test substrate and the profile of a temperature change ΔT due to heat generation/heat diffusion.
Figure 14:
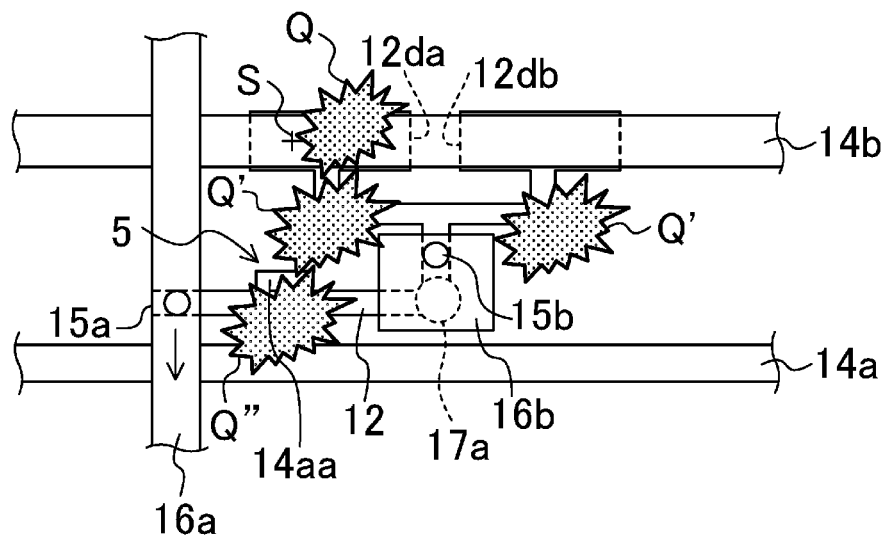
FIG. 14 is a partially enlarged view showing heat generation in a pixel in which a short-circuit defect S has occurred in one of a pair of auxiliary capacitors.
Figure 15:
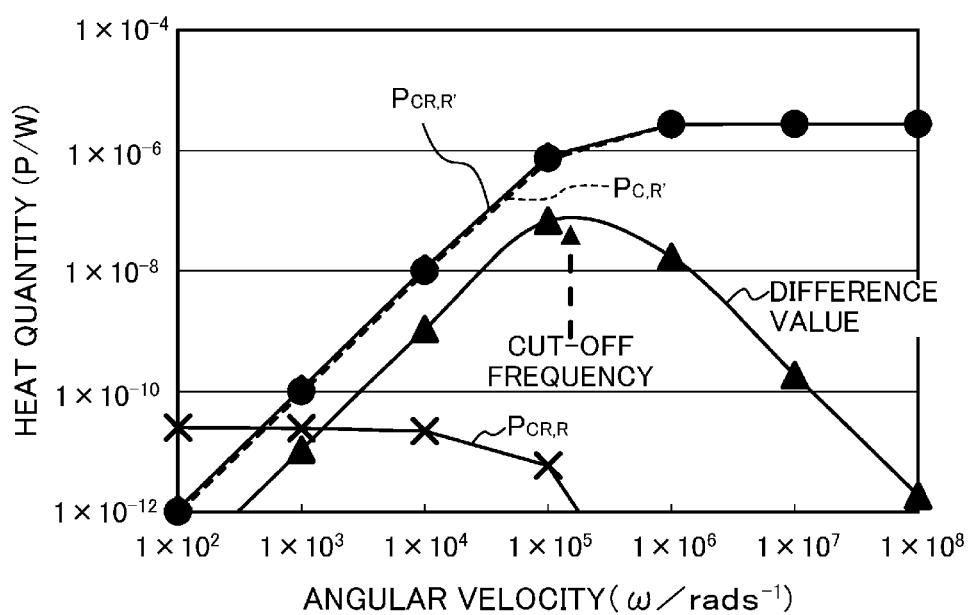
FIG. 15 is a graph showing a relationship between the heat value P of a resistance R' connected in series to a pair of auxiliary capacitors and a frequency (angular velocity ω).
Figure 16:
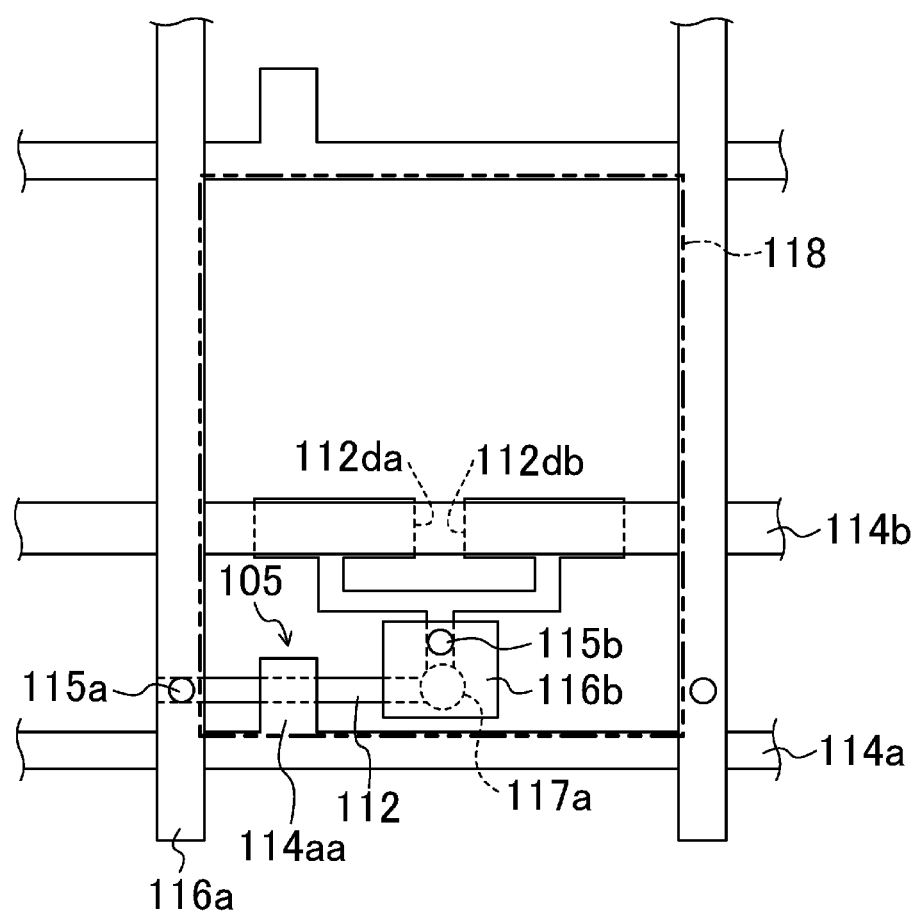
FIG. 16 is a plan view of an active matrix substrate 120 in which a pair of capacitor electrodes are provided in each pixel.

Next, a test signal is input to each of a plurality of input terminals (not shown) of the test substrate 19 while a tip portion of the prober 42 is pressed onto the input terminal, to access the TFT 5 of each pixel P and write charge to the pair of auxiliary capacitors of each pixel P, and thereafter, the charge written in the auxiliary capacitors is read out to detect the presence or absence of a short-circuit defect S (see FIG. 9) in the pair of auxiliary capacitors in each pixel P (see St1 in FIG. 4). Thereafter, if there is the short-circuit defect S, coordinates of the defective pixel on the test substrate 19 are identified (see St2 in FIG. 4), and are sent to a control/analysis system (see St3 in FIG. 4). Here, in a region which does not have a defective pixel, the amount of charge read from each pixel P is uniformly detected, and in a region which has a defective pixel, the amount of charge in the defective pixel is different from that of each pixel P around the defective pixel, and therefore, a defective pixel can be found by a statistical process.

<Defect Position Identification Step>

Initially, the stage 30a on which the test substrate 19 in which coordinates of a defective pixel identified in the defective pixel detection step is placed is appropriately moved to position the defective pixel having the short-circuit defect S below the first objective lens 51. The defective pixel and a vicinity thereof are magnified by a microscope (see St4 in FIG. 4).

Next, a test signal is input to each of the input terminals (not shown) of the test substrate 19 while the tip portion of the prober 42 is pressed onto the input terminal, to access the TFT 5 of each pixel P and write charge to the pair of auxiliary capacitors of each pixel P. In addition, an alternating current is applied to each capacitor line 14b, and the frequency of the alternating current is increased, whereby the defective pixel is caused to generate heat (see St5 in FIG. 4). In this case, a temperature difference occurs between the pair of auxiliary capacitors in the defective pixel. Therefore, by using far-infrared thermography to sense the temperature difference caused by the heat generation of the defective pixel, the auxiliary capacitor having the short-circuit defect S in the defective pixel can be identified (see St6 in FIG. 4).

<Defect Repairing Step>

Initially, for example, by sliding the slide section 74b within the guide rail 74a, the short-circuit defect S of the defective pixel identified in the defect position identification step is positioned below the second objective lens 61b, and the optical system is switched from the infrared system to the laser repairing system (see St7 in FIG. 4). Thereafter, the array testing device 41a is used to switch and test the waveforms of test signals to send the defect category of the defect S in the defective pixel to the control/analysis system, which then analyzes a cause for the short-circuit defect S based on the position, defect category, etc. (see St7 in FIG. 4), and selects a recipe for repairing (see St8 in FIG. 4).

Next, for example, by irradiating the test substrate 19 with laser light, one of branching portions of the drain region 12d of the semiconductor layer 12 that is connected to the capacitor electrode 12da corresponding to the position of the short-circuit defect S is cut off to repair the short-circuit defect S (see St9 in FIG. 4).

Moreover, for example, after the optical system is switched from the laser repairing system to the infrared system, a test signal is input to each input terminal of the test substrate 19 to determine whether or not the defective pixel has been successfully repaired, using far-infrared thermography (see St10 in FIG. 4).

<Pixel Electrode Formation Step>

Initially, for example, an acrylic resin etc. is applied onto the entire test substrate 19 on which the short-circuit defect S has been repaired in the defect repairing step, by spin coating, to form the second interlayer insulating film 17.

Next, the second interlayer insulating film 17 is partially removed by etching to form the contact hole 17a.

Finally, for example, a transparent conductive film, such as an indium tin oxide (ITO) film etc., is formed on the entire substrate on which the second interlayer insulating film 17 having the contact hole 17a has been formed, by sputtering, and then patterned by photolithography, to form the pixel electrode 18.

Thus, the active matrix substrate 20a can be manufactured.

As described above, according to the device (the substrate repairing device 80a) and method for manufacturing the active matrix substrate 20a of this embodiment, in the defective pixel detector 40a and the defective pixel detection step, by inputting a test signal to the test substrate 19, the signal (source) line number and scanning (gate line) number of a defective pixel having a short-circuit defect S are determined, whereby the coordinates of the defective pixel in the test substrate 19 are found. Thereafter, in the defect position identifier 50 and the defect position identification step, by inputting a test signal to the test substrate 19 again, the defective pixel is caused to generate heat, and the heat generation in the defective pixel at the coordinate point found by the defective pixel detector 40a is sensed using far-infrared thermography, whereby the position of the short-circuit defect S in the defective pixel is identified. In this case, according to Wien's displacement law, the peak wavelength of radiation at room temperature is 9 µm, and therefore, the heat generation observed in the vicinity of the short-circuit defect S in the defective pixel is sensed by far-infrared thermography with higher sensitivity than when near-infrared thermography is used, which is expected to be used in the test method described in PATENT DOCUMENT 1. Therefore, the position of the short-circuit defect in the defective pixel can be identified as easily as possible.

According to the substrate repairing device 80a of this embodiment, the defective pixel detector 40a includes the high frequency signal generator 43. Therefore, a test signal having an alternating current waveform with any frequency within a predetermined frequency band can be input to a plurality of separated auxiliary capacitors in each pixel P. As a result, a position to be repaired in the defective pixel caused by the short-circuit defect S in the test substrate 19 can be easily sensed by increasing the temperature using direct or indirect means.

According to the substrate repairing device 80a of this embodiment, the first objective lens 51 for far-infrared light of the defect position identifier 50 and the second objective lenses 61a and 61b for laser light of the defect repairer 60 can be switched in a sliding manner at a position away from the stage 30a. Therefore, a lens displacement which occurs when the first objective lens 51 is switched to the second objective lens 61a or 61b can be reduced, whereby the short-circuit defect S whose position has been identified by the defect position identifier 50 can be quickly and reliably repaired by the defect repairer 60.

According to the method for manufacturing the active matrix substrate 20a of this embodiment, the test substrate 19 is a substrate on which the pixel electrodes 18, and the second interlayer insulating film 17 provided below the pixel electrodes 18, have not yet been formed. Therefore, after the defect repairing step, the pixel electrodes 18, and the second interlayer insulating film 17 provided below the pixel electrodes 18, are formed. Therefore, holes resulting from repairing by irradiation with laser light, abnormalities in the surface state, etc. in the surface of the active matrix substrate 20a are filled or buried and flattened by the formation of the second interlayer insulating film 17, whereby the active matrix substrate has as flat a surface as that which is obtained by a commonly used manufacturing method. As a result, in a liquid crystal display panel including the active matrix substrate 20a, the disturbance of alignment of the liquid crystal layer at the laser repaired portion is reduced or eliminated, resulting in defect repairing which can maintain high display quality without light leakage which would be induced by repairing.

Note that, in this embodiment, a method for detecting coordinates of a defective pixel in a test substrate which will become an active matrix substrate, by a charge detection technique, has been illustrated. Alternatively, in the present invention, the coordinates of a defective pixel may be detected by other electrical testing techniques, such as pixel potential imaging etc.

In this embodiment, a method for electrically testing a test substrate on which pixel electrodes have not yet been formed has been illustrated. Alternatively, in the present invention, an active matrix substrate on which pixel electrodes have been formed may be electrically tested for the purpose of extraction of a defect in a pixel electrode.

In this embodiment, two separated capacitor electrodes have been illustrated. Alternatively, in the present invention, even if three or more separated capacitor electrodes are used, the same operation and advantages can be obtained.

Second Embodiment of the Invention

Figure 5:
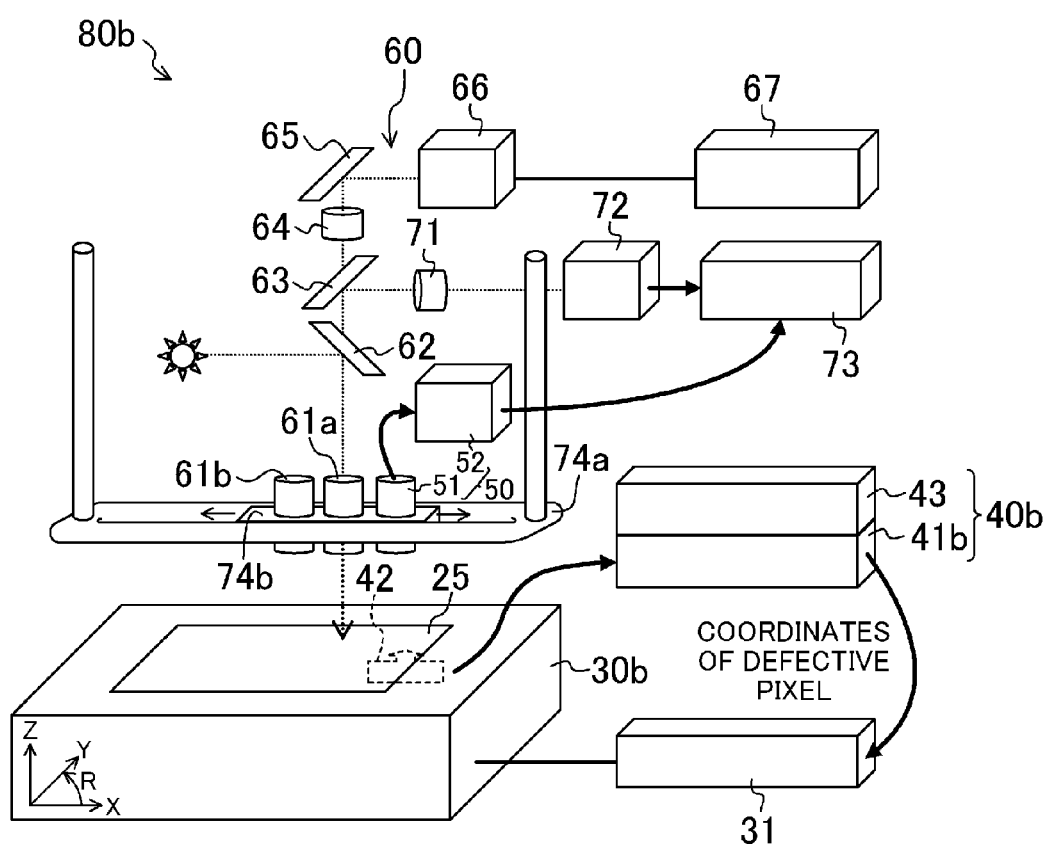
FIG. 5 is a perspective view of a panel repairing device 80b according to a second embodiment.

FIG. 5 is a perspective view of a panel repairing device 80b according to this embodiment. Note that, in embodiments described below, the same parts as those of FIGS. 1-4 are indicated by the same reference characters and will not be described in detail.

In the first embodiment, a device and method for manufacturing an active matrix substrate has been illustrated in which a short-circuit defect is detected and repaired on a substrate before the substrate is incorporated into a panel. In this embodiment, a device and method for manufacturing a liquid crystal display panel (hereinafter referred to as a "test panel 25") will be illustrated in which a short-circuit defect is detected and repaired on a substrate which has been incorporated into the panel.

As shown in FIG. 5, the substrate repairing device 80b includes a stage 30b for placing the test panel 25 described below, a defective pixel detector 40b which inputs a test signal to the test panel 25 placed on the stage 30b with the counter substrate facing the stage 30b, to detect coordinates of a defective pixel in which a short-circuit defect has occurred, a defect position identifier 50 for inputting to the test panel 25 placed on the stage 30b a test signal to cause a defective pixel to generate heat, and identify a short-circuit position in the defective pixel, and a defect repairer 60 for repairing a short-circuit defect identified by the defect position identifier 50, by irradiation with laser light.

As shown in FIG. 5, the stage 30b is connected to a stage controller 31, and can be appropriately moved in the X-axis direction, Y-axis direction, Z-axis direction, and R-axis direction (the rotational axis of the stage) while the test panel 25 is placed on an upper surface thereof. The stage 30b is made of a transparent material through which light emitted from a backlight (not shown) is transmitted to a display region (not shown) of the placed test panel 25.

As shown in FIG. 5, the defective pixel detector 40b includes a prober 42 for inputting a test signal to the test panel 25, a dynamic operating test device 41b for driving the test panel 25 to display an image to detect the presence or absence of a short-circuit defect in each pixel, thereby finding coordinates of a defective pixel and supplying the coordinates of the defective pixel in the test panel 25 to the stage controller 31, and a high frequency signal generator 43 for generating a high frequency test signal which is to be input from the dynamic operating test device 41b to the test panel 25.

Next, the test panel 25, i.e., a liquid crystal display panel, will be described.

The test panel 25 includes an active matrix substrate and a counter substrate facing each other, and a liquid crystal layer enclosed between the active matrix substrate and the counter substrate.

The active matrix substrate has substantially the same configuration as that of the active matrix substrate 20a of the first embodiment.

The counter substrate includes, for example, a black matrix provided on an insulating substrate and having the shape of a frame with a grid therein, a color filter including a red layer, a green layer, and a blue layer, which is provided between each grid bar of the black matrix, and a common electrode covering the black matrix and the color filter.

The liquid crystal layer is formed of, for example, a nematic liquid crystal material having electro-optic properties.

In the test panel 25 thus configured, in each pixel P, which is the smallest unit of an image, when a gate signal is transferred via a gate line (14a) to a gate electrode (14aa), so that a TFT (5) is turned on, a source signal is transferred via a source line (16a) to a source electrode, and predetermined charge is written via a semiconductor layer (12) and a drain electrode (16b) to a pixel electrode (18). In this case, there is a potential difference between each pixel electrode (18) of the active matrix substrate (20a) and the common electrode of the counter substrate, and a predetermined voltage is applied to the liquid crystal layer. Moreover, in the test panel 25, the alignment state of the liquid crystal layer is changed by changing the magnitude of the voltage applied to the liquid crystal layer 40 to adjust the light transmittance of the liquid crystal layer, whereby a colorful image is displayed.

A method for manufacturing a liquid crystal display panel using the substrate repairing device 80b having the above configuration is the same as that described above, except that, in the defective pixel detection step and defect position identification step of the first embodiment, the substrate test by the charge detection technique is replaced with a dynamic operating test, and in the defect repairing step of the first embodiment, the test substrate 19 is replaced with the test panel 25 as a target to be irradiated with laser light, and therefore, will not be described.

According to the device (the panel repairing device 80b) and method for manufacturing a liquid crystal display panel of this embodiment, in the defective pixel detector 40b and the defective pixel detection step, the position of a defective pixel having a short-circuit defect S is detected by inputting a test signal to the test panel 25 to find coordinates of the defective pixel in the test panel 25. In the defect position identifier 50 and the defect position identification step, the defective pixel is caused to generate heat by inputting a test signal to the test panel 25 again. Here, the heat generated in the defective pixel is propagated through the inside of the substrate to reach the back surface, and therefore, even if the test panel 25 is placed on the stage 30b with the counter substrate facing the stage 30b, a change in the temperature of a defect position can be sensed using far-infrared thermography. By sensing heat generation in the defective pixel at the coordinate point found by the defective pixel detector 40b using far-infrared thermography, the position of a short-circuit defect in the defective pixel is identified. In this case, according to Wien's displacement law, the peak wavelength of radiation at room temperature is 9 μm, and therefore, the heat generation in the short-circuit defect in the defective pixel is sensed by far-infrared thermography with higher sensitivity than when near-infrared thermography is used, which is expected to be used in the test method described in PATENT DOCUMENT 1. Therefore, in a liquid crystal display panel, the position of a short-circuit defect in a defective pixel can be identified as easily as possible.

Other Embodiments

Figure 6:
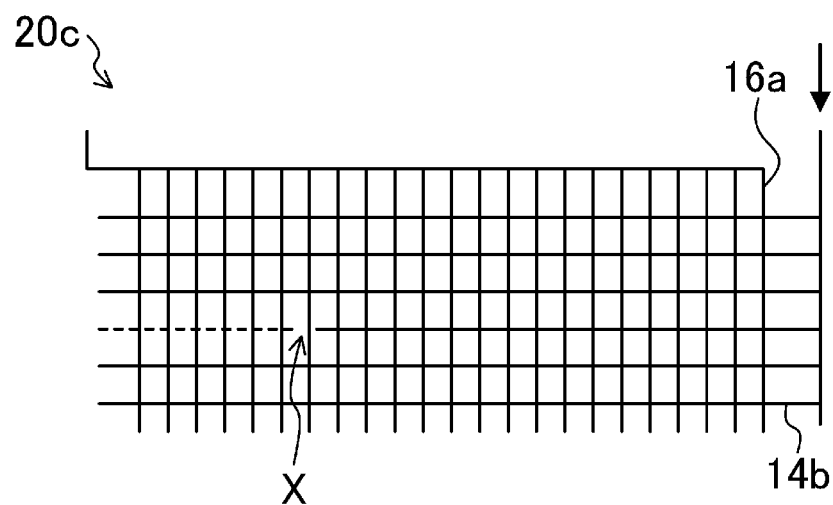
FIG. 6 is a plan view of an active matrix substrate 20c according to other embodiments.
Figure 7:
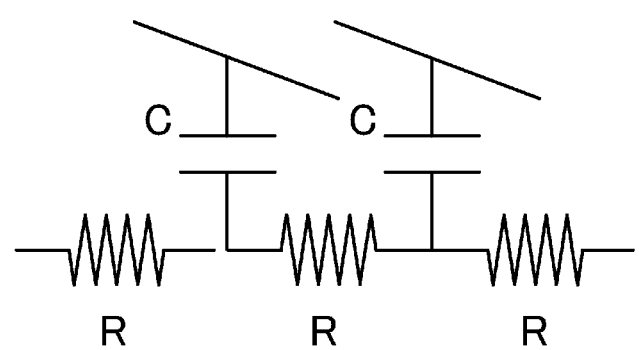
FIG. 7 is a plan view showing source lines included in the active matrix substrate 20c, capacitor lines having a resistance R and orthogonally intersecting the source lines, and capacitances C formed at the intersections.
Figure 8:
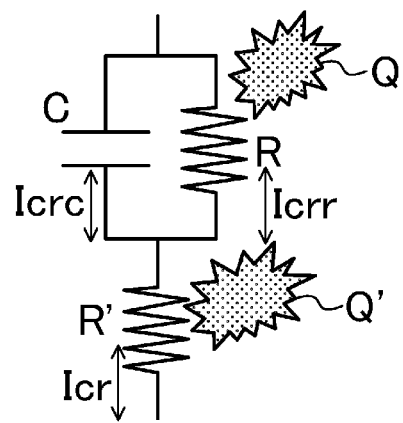
FIG. 8 is a diagram showing an equivalent circuit of an auxiliary capacitor in which a short-circuit defect has occurred.

FIG. 6 is a plan view of an active matrix substrate 20c of this embodiment. FIG. 7 is a plan view showing source lines included in the active matrix substrate 20c, capacitor lines having a resistance R and orthogonally intersecting the source lines, and capacitances C formed at the intersections.

In the above embodiments, a device and method for detecting and repairing a short-circuit defect in an active matrix substrate and a liquid crystal display panel have been illustrated. The present invention is also applicable to detection of a break in a capacitor line.

Specifically, as shown in FIGS. 6 and 7, it is considered that the resistance R of the interconnect and the capacitance C connected thereto in a branched configuration form a CR circuit in each pixel. Here, if a break occurs at a portion X of a capacitor line 14b, a high frequency signal is not input to a portion (indicated by a dashed line) of the capacitor line 14b on the left of the portion X. In this case, heat generation caused by high frequency oscillation does not occur in pixels along the portion indicated by the dashed line of the capacitor line 14b. On the other hand, a high frequency signal is input to the other capacitor lines 14b indicated by solid lines, and therefore, heat generation caused by high frequency oscillation occurs in pixels along the capacitor lines 14b indicated by solid lines. Therefore, a break in the capacitor line 14b can be detected by sensing a change in temperature caused by heat generation of each pixel using thermography.

In the above embodiments, an active matrix substrate and a liquid crystal display panel including the active matrix substrate have been illustrated. Alternatively, the present invention is also applicable to other display panels such as an organic electroluminescence (EL) display panel etc., and an active matrix substrate included in a sensor substrate which reads charge on each pixel electrode, such as an X-ray sensor etc.

INDUSTRIAL APPLICABILITY

As described above, according to the present invention, the position of a short-circuit defect in a pixel in an active matrix substrate can be easily identified. The present invention is useful for manufacture of an active matrix substrate and a display panel including the active matrix substrate.

| DESCRIPTION OF REFERENCE CHARACTERS | |
|---|---|
| P | PIXEL |
| S | SHORT-CIRCUIT DEFECT |
| 5 | TFT |
| 12da, 12db | CAPACITOR ELECTRODE |
| 13 | GATE INSULATING FILM |
| 14b | CAPACITOR LINE |
| 17 | SECOND INTERLAYER INSULATING FILM |
| 18 | PIXEL ELECTRODE |
| 19 | TEST SUBSTRATE |
| 20a, 20c | ACTIVE MATRIX SUBSTRATE |
| 25 | LIQUID CRYSTAL DISPLAY PANEL (TEST PANEL) |
| 30a, 30b | STAGE |
| 40a, 40b | DEFECTIVE PIXEL DETECTOR |
| 43 | HIGH FREQUENCY SIGNAL GENERATOR |
| 50 | DEFECT POSITION IDENTIFIER |
| 51 | FIRST OBJECTIVE LENS |
| 60 | DEFECT REPAIRER |
| 61a, 61b | SECOND OBJECTIVE LENS |
| 80a | SUBSTRATE REPAIRING DEVICE (DEVICE FOR MANUFACTURING ACTIVE MATRIX SUBSTRATE) |
| 80b | PANEL REPAIRING DEVICE (DEVICE FOR MANUFACTURING DISPLAY PANEL) |

The invention claimed is:

1. A device for manufacturing an active matrix substrate including a plurality of pixels arranged in a matrix, in which a short-circuit defect in the active matrix substrate is detected and repaired, the device comprising:

a stage configured to place a test substrate which will become the active matrix substrate;

a defective pixel detector configured to input a test signal to the test substrate placed on the stage, and electrically detect coordinates of a defective pixel in which a short-circuit defect has occurred; and a defect position identifier configured to input the test signal to the test substrate placed on the stage to cause the defective pixel detected by the defective pixel detector to generate heat, and sense the heat generation in the defective pixel using far-infrared thermography, thereby identifying a position of the short-circuit defect in the defective pixel.

2. The device of claim 1, wherein the test substrate includes a plurality of capacitor lines arranged in parallel with each other, a thin film transistor for each of the pixels, and a plurality of separated capacitor electrodes for each of the pixels, where the plurality of separated capacitor electrodes for each of the pixels overlap the corresponding capacitor line with an insulating film being interposed therebetween and are connected to the corresponding thin film transistor, and the defective pixel detector detects the coordinates of the defective pixel using a charge detection technique.

3. The device of claim 2, wherein the defective pixel detector includes a high frequency signal generator.

4. The device of claim 1, further comprising:

a defect repairer configured to repair the short-circuit defect identified by the defect position identifier, by irradiation with laser light.

5. The device of claim 4, wherein the defect position identifier includes a first objective lens for far-infrared light, the defect repairer includes a second objective lens for laser light, and the first and second objective lenses are switched in a sliding manner at a position away from the stage.

6. A method for manufacturing an active matrix substrate including a plurality of pixels arranged in a matrix, in which a short-circuit defect in the active matrix substrate is detected and repaired, the method comprising:

a defective pixel detection step of inputting a test signal to a test substrate which will become the active matrix substrate, and electrically detecting coordinates of a defective pixel in which a short-circuit defect has occurred; and a defect position identification step of inputting the test signal to the test substrate to cause the defective pixel detected in the defective pixel detection step to generate heat, and sensing the heat generation in the defective pixel using far-infrared thermography, thereby identifying a position of the short-circuit defect in the defective pixel.

7. The method of claim 6, further comprising:

a defect repairing step of repairing the short-circuit defect identified in the defect position identification step, by irradiation with laser light.

8. The method of claim 7, wherein the test substrate includes a plurality of capacitor lines arranged in parallel with each other, a thin film transistor for each of the pixels, and a plurality of separated capacitor electrodes for each of the pixels, where the plurality of separated capacitor electrodes for each of the pixels overlap the corresponding capacitor line with an insulating film being interposed therebetween and are connected to the corresponding thin film transistor, the defective pixel detection step detects a short-circuit defect between each of the capacitor lines and the corresponding plurality of capacitor electrodes, and the defect repairing step disconnects the connection between at least one of the plurality of capacitor electrodes corresponding to the position of the short-circuit defect identified in the defect position identification step, and the corresponding thin film transistor.

9. The method of claim 6, wherein the test substrate is a substrate on which a plurality of pixel electrodes, and an insulating film below the pixel electrodes, have not yet been formed.

10. The method of claim 6, wherein the test substrate includes a plurality of capacitor lines arranged in parallel with each other, a thin film transistor for each of the pixels, and a plurality of separated capacitor electrodes for each of the pixels, where the plurality of separated capacitor electrodes for each of the pixels overlap the corresponding capacitor line with an insulating film being interposed therebetween and are connected to the corresponding thin film transistor, in each of the pixels, the plurality of capacitor electrodes each form an auxiliary capacitor having a capacitance C, and an interconnect having a resistance R' is connected in series to each of the auxiliary capacitors, and in the defect position identification step, a high frequency signal having an angular velocity $\omega$ is input to the plurality of auxiliary capacitors of each of the pixels, where $\omega CR'$ is 0.1-10, preferably 0.3-3.

11. The method of claim 8, wherein in each of the pixels, the plurality of capacitor electrodes each form an auxiliary capacitor having a capacitance C, and an interconnect having a resistance R' is connected in series to each of the auxiliary capacitors, and in the defect position identification step, a high frequency signal having an angular velocity $\omega$ is input to the plurality of auxiliary capacitors of each of the pixels, where $\omega CR'$ is 0.1-10, preferably 0.3-3.

12. A device for manufacturing a display panel including a plurality of pixels arranged in a matrix, in which a short-circuit defect in the display panel is detected and repaired, the device comprising:

a stage configured to place a test panel which will become the display panel;

a defective pixel detector configured to input a test signal to the test panel placed on the stage, and optically detect coordinates of a defective pixel in which a short-circuit defect has occurred; and a defect position identifier configured to input the test signal to the test panel placed on the stage to cause the defective pixel detected by the defective pixel detector to generate heat, and sense the heat generation in the defective pixel using far-infrared thermography, thereby identifying a position of the short-circuit defect in the defective pixel.

13. A method for manufacturing a display panel including a plurality of pixels arranged in a matrix, in which a short-circuit defect in the display panel is detected and repaired, the method comprising:

a defective pixel detection step of inputting a test signal to a test panel which will become the display panel, and optically detect coordinates of a defective pixel in which a short-circuit defect has occurred; and a defect position identification step of inputting the test signal to the test panel to cause the defective pixel detected in the defective pixel detection step to generate heat, and sensing the heat generation in the defective pixel using far-infrared thermography, thereby identifying a position of the short-circuit defect in the defective pixel.

\* \* \* \* \*